US012791940B2

(12) United States Patent
Shibayama et al.

(10) Patent No.: US 12,791,940 B2
(45) **Date of Patent: *Nov. 10, 2026**

(54) FILM-FORMING COMPOSITION

(71) Applicant: NISSAN CHEMICAL CORPORATION, Tokyo (JP)

(72) Inventors: Wataru Shibayama, Toyama (JP); Satoshi Takeda, Toyama (JP); Shuhei Shigaki, Toyama (JP); Ken Ishibashi, Toyama (JP); Kodai Kato, Toyama (JP); Makoto Nakajima, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 757 days.

This patent is subject to a terminal disclaimer.

(21) Appl. No.: 17/916,512

(22) PCT Filed: Mar. 31, 2021

(86) PCT No.: PCT/JP2021/014092
§ 371 (c)(1),
(2) Date: Sep. 30, 2022

(87) PCT Pub. No.: WO2021/201197
PCT Pub. Date: Oct. 7, 2021

(65) Prior Publication Data

US 2023/0152700 A1 May 18, 2023

(30) Foreign Application Priority Data

Mar. 31, 2020 (JP) ................................ 2020-064851
Feb. 1, 2021 (JP) ................................ 2021-014599

(51) Int. Cl.

| | |
|---|---|
| ***G03F 7/075*** | (2006.01) |
| ***G03F 7/11*** | (2006.01) |
| ***G03F 7/20*** | (2006.01) |
| ***G03F 7/32*** | (2006.01) |
| ***H10P 50/00*** | (2026.01) |
| ***H10P 50/24*** | (2026.01) |
| ***H10P 50/28*** | (2026.01) |
| ***H10P 76/20*** | (2026.01) |

(52) U.S. Cl.
CPC .............. *G03F 7/0755* (2013.01); *G03F 7/11* (2013.01); *G03F 7/2004* (2013.01); *G03F 7/322* (2013.01); *H10P 50/242* (2026.01); *H10P 50/287* (2026.01); *H10P 50/692* (2026.01); *H10P 50/695* (2026.01); *H10P 76/2042* (2026.01); *H10P 76/2043* (2026.01)

(58) Field of Classification Search
CPC ........................................................ G03F 7/11
See application file for complete search history.

(56) References Cited

U.S. PATENT DOCUMENTS

| | | | | |
|---|---|---|---|---|
| 2010/0330505 | A1* | 12/2010 | Nakajima | G03F 7/11 524/588 |
| 2011/0143149 | A1 | 6/2011 | Shibayama et al. | |
| 2011/0287369 | A1 | 11/2011 | Shibayama et al. | |
| 2013/0078814 | A1 | 3/2013 | Shibayama et al. | |
| 2016/0096977 | A1 | 4/2016 | Tachibana et al. | |
| 2016/0363861 | A1* | 12/2016 | Ongayi | C09D 183/08 |
| 2017/0153549 | A1* | 6/2017 | Shibayama | C09D 183/04 |
| 2017/0168397 | A1 | 6/2017 | Shibayama et al. | |

FOREIGN PATENT DOCUMENTS

| | | | |
|---|---|---|---|
| JP | 2010113328 | A * | 5/2010 |
| JP | 2011-215385 | A | 10/2011 |
| JP | 2016-074772 | A | 5/2016 |
| JP | 2017-020000 | A | 1/2017 |
| KR | 10-2017-0033265 | A | 3/2017 |
| WO | 2009/104552 | A1 | 8/2009 |
| WO | 2010/021290 | A1 | 2/2010 |
| WO | 2010/071155 | A1 | 6/2010 |

OTHER PUBLICATIONS

JP-2010113328-A English Machine Translation (Year: 2025).*
Jun. 1, 2021 Written Opinion ssued in International Application No. PCT/JP2021/014092.
Jun. 1, 2021 Search Report issued in International Application No. PCT/JP2021/014092.

(Continued)

*Primary Examiner* — Chanceity N Robinson
(74) *Attorney, Agent, or Firm* — Oliff PLC

(57) ABSTRACT

A film-forming composition includes a solvent and hydrolysis condensate prepared through hydrolysis and condensation of a hydrolyzable silane compound by using an acidic compound containing two or more acidic groups. The hydrolyzable silane compound contains an amino-group-containing silane with formula (1). $R^1$ is an organic group containing an amino group. $R^2$ is a substitutable alkyl, substitutable aryl, substitutable aralkyl, substitutable halogenated alkyl, substitutable halogenated aryl, substitutable halogenated aralkyl, substitutable alkoxyalkyl, substitutable alkoxyaryl, substitutable alkoxyaralkyl, or substitutable alkenyl group, or an organic group containing an epoxy, acryloyl, methacryloyl, mercapto, or a cyano group. $R^3$ is an alkoxy, aralkyloxy, or acyloxy group or halogen atom. a is an integer of 1 or 2, b of 0 or 1; and a and b satisfy a relation of a+b≤2.

$$R^1_aR^2_bSi(R^3)_{4-(a+b)} \quad (1)$$

13 Claims, No Drawings

(56) References Cited

OTHER PUBLICATIONS

Mar. 18, 2025 Office Action issued in Korean Patent Application No. 10-2022-7036757.
Mar. 5, 2025 Office Action issued in Japanese Patent Application No. 2022-512681.
Sep. 5, 2024 Office Action issued in Taiwanese Patent Application No. 110111934.
Aug. 27, 2025 Office Action issued in Japanese Patent Application No. 2022-512681.
Dec. 31, 2025 Office Action issued in Chinese Patent Application No. 202180026667.7.

* cited by examiner

FILM-FORMING COMPOSITION

TECHNICAL FIELD

The present invention relates to a film-forming composition.

BACKGROUND ART

Fine processing by lithography using photoresists has been conventionally performed in the production of semiconductor devices. The fine processing is a processing method involving formation of a photoresist thin film on a semiconductor substrate (e.g., a silicon wafer); irradiation of the thin film with active rays (e.g., ultraviolet rays) through a mask pattern having a semiconductor device pattern drawn thereon; development of the irradiated thin film; and etching of the substrate with the resultant photoresist film pattern serving as a protective film, to thereby form, on the surface of the substrate, fine irregularities corresponding to the pattern.

In recent years, resist films have been significantly thinned in state-of-the-art semiconductor devices. In particular, a tri-layer (including a resist film, a silicon-containing resist underlayer film, and an organic underlayer film) process requires favorable lithographic property of an Si-HM (silicon-hard mask) serving as the resist underlayer film, as well as high etching rate of the Si-HM during wet etching. Thus, the Si-HM is required to have high dissolubility in a wet etching agent (e.g., HF).

In order to meet such requirements, in particular, an EUV (extreme ultraviolet) lithographic process involves introduction of a large amount of a functional group exhibiting high adhesion to a resist into a polymer for improving lithographic property, and development of a material containing a large amount of a photoacid generator added to a composition. However, such a material causes a serious problem of reduction in the dissolubility of the material in a wet etching agent (e.g., HF) due to an increase in the amount of an organic component.

Under such circumstances, there have been reported a resist underlayer film-forming composition containing a silane compound having an onium group, and a resist underlayer film containing a silane compound having an anionic group (Patent Documents 1 and 2).

PRIOR ART DOCUMENTS

Patent Documents

Patent Document 1: WO 2010/021290
Patent Document 2: WO 2010/071155

SUMMARY OF THE INVENTION

Problems to be Solved by the Invention

In view of the above-described circumstances, an object of the present invention is to provide a composition for forming a film capable of effectively functioning as a resist underlayer film exhibiting resistance to a solvent in a composition for forming a resist film serving as an upper layer, favorable etching property to a fluorine-containing gas, and more favorable lithographic property.

Means for Solving the Problems

The present inventors have conducted extensive studies for solving the aforementioned problems, and as a result have found that a composition containing a solvent and a hydrolysis condensate prepared through hydrolysis and condensation of a hydrolyzable silane compound containing a specific hydrolyzable silane by using an acidic compound containing two or more acidic groups can form a film capable of effectively functioning as a resist underlayer film exhibiting resistance to a solvent in a composition for forming a resist film serving as an upper layer, favorable etching property to a fluorine-containing gas, and more favorable lithographic property. The present invention has been accomplished on the basis of this finding.

Accordingly, a first aspect of the present invention relates to a film-forming composition comprising a solvent, and a hydrolysis condensate prepared through hydrolysis and condensation of a hydrolyzable silane compound by using an acidic compound containing two or more acidic groups, the film-forming composition being characterized in that:

the hydrolyzable silane compound contains an amino-group-containing silane of the following Formula (1):

$$R^1_aR^2_bSi(R^3)_{4-(a+b)} \quad (1)$$

(wherein $R^1$ is a group bonded to the silicon atom, and is each independently an organic group containing an amino group;

$R^2$ is a group bonded to the silicon atom, and is a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, or a cyano group;

$R^3$ is a group or atom bonded to the silicon atom, and is each independently an alkoxy group, an aralkyloxy group, an acyloxy group, or a halogen atom;

a is an integer of 1 or 2;

b is an integer of 0 or 1; and a and b satisfy a relation of $a+b\leq2$).

A second aspect of the present invention is the film-forming composition according to the first aspect, wherein the two or more acidic groups contain two or more mutually different groups selected from the group consisting of a sulfonate group, a phosphate group, a carboxy group, and a phenolic hydroxy group.

A third aspect of the present invention is the film-forming composition according to the second aspect, wherein the two or more acidic groups contain at least one selected from the group consisting of a sulfonate group, a phosphate group, a carboxy group, and a phenolic hydroxy group, and at least one selected from the group consisting of a carboxy group and a phenolic hydroxy group.

A fourth aspect of the present invention is the film-forming composition according to any one of the first to third aspects, wherein the acidic compound contains an aromatic ring.

A fifth aspect of the present invention is the film-forming composition according to the fourth aspect, wherein at least one of the two or more acidic groups is directly bonded to the aromatic ring.

A sixth aspect of the present invention is the film-forming composition according to the fifth aspect, wherein all of the two or more acidic groups are directly bonded to the aromatic ring.

A seventh aspect of the present invention is the film-forming composition according to any one of the first to sixth aspects, wherein the acidic compound contains an acidic compound containing two or three acidic groups.

An eighth aspect of the present invention is the film-forming composition according to the first aspect, wherein the two or more acidic groups are a sulfonate group and a phenolic hydroxy group; a sulfonate group and a carboxy group; a sulfonate group, a carboxy group, and a phenolic hydroxy group; a phosphate group and a phenolic hydroxy group; a phosphate group and a carboxy group; a phosphate group, a carboxy group, and a phenolic hydroxy group; or a carboxy group and a phenolic hydroxy group.

A ninth aspect of the present invention is the film-forming composition according to the first aspect, wherein the acidic compound contains an acidic compound of the following Formula (S):

$$(R^A)_q\text{—Ar—}(R^S)_r \qquad \text{(S)}$$

(wherein Ar is a $C_{6-20}$ aromatic ring; $R^A$ is an acidic group; $R^S$ is a substituent; q is the number of acidic groups bonded to the aromatic ring, and is an integer of 2 to 5; r is the number of substituents bonded to the aromatic ring, and is an integer of 0 to 3; q $R^A{}_S$ are mutually different groups; and r $R^S{}_S$ are identical to or different from one another).

A tenth aspect of the present invention is the film-forming composition according to any one of the first to ninth aspects, wherein the organic group containing an amino group is a group of the following Formula (A1):

(A1)

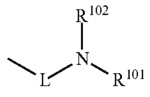

(wherein $R^{101}$ and $R^{102}$ are each independently a hydrogen atom or a hydrocarbon group, and L is a substitutable alkylene group).

An eleventh aspect of the present invention is the film-forming composition according to the tenth aspect, wherein the alkylene group is a linear or branched alkylene group having a carbon atom number of 1 to 10.

A twelfth aspect of the present invention is the film-forming composition according to any one of the first to eleventh aspects, wherein the composition is for forming a resist underlayer film used in a lithographic process.

A thirteenth aspect of the present invention is a resist underlayer film formed from the film-forming composition according to any one of the first to twelfth aspects.

A fourteenth aspect of the present invention is a method for producing a semiconductor device, the method comprising:

a step of forming an organic underlayer film on a substrate;

a step of forming, on the organic underlayer film, a resist underlayer film from the film-forming composition according to any one of the first to twelfth aspects; and a step of forming a resist film on the resist underlayer film.

Effects of the Invention

The use of the film-forming composition of the present invention can provide a film suitable as a resist underlayer film which can be readily formed by a wet process (e.g., spin coating), which can achieve favorable lithographic property when used together with a resist film and an organic underlayer film in a tri-layer process, and which exhibits resistance to a solvent in a composition for forming the resist film serving as an upper layer, and favorable etching property to a fluorine-containing gas.

Thus, it is expected that a highly reliable semiconductor device can be produced by using the film-forming composition.

MODES FOR CARRYING OUT THE INVENTION

The present invention will next be described in more detail.

The film-forming composition of the present invention contains a hydrolysis condensate of a hydrolyzable silane compound. The hydrolysis condensate includes a siloxane polymer which is a condensate prepared through complete condensation as well as a siloxane polymer which is a partial hydrolysis condensate prepared through incomplete condensation. Such a partial hydrolysis condensate is a polymer prepared through hydrolysis and condensation of a silane compound, as in the case of a condensate prepared through complete condensation. However, the partial hydrolysis condensate contains remaining Si—OH groups, due to partial or incomplete hydrolysis and condensation of the silane compound.

As used herein, the "solid content" of the composition refers to all components (except for the solvent) contained in the composition.

The film-forming composition of the present invention contains a hydrolysis condensate prepared through hydrolysis and condensation of a hydrolyzable silane compound by using an acidic compound containing two or more acidic groups, and the hydrolyzable silane compound contains an amino-group-containing silane of the following Formula (1):

$$R^1{}_aR^2{}_bSi(R^3)_{4-(a+b)} \qquad (1)$$

In Formula (1), $R^1$ is a group bonded to the silicon atom, and is an organic group containing an amino group; $R^2$ is a group bonded to the silicon atom, and is a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, or a cyano group; $R^3$ is a group or atom bonded to the silicon atom, and is each independently an alkoxy group, an aralkyloxy group, an acyloxy group, or a halogen atom; a is an integer of 1 or 2; b is an integer of 0 or 1; and a and b satisfy a relation of $a+b \le 2$.

The alkyl group in Formula (1) is a monovalent group derived from an alkane through removal of one hydrogen atom. The alkyl group may have a linear, branched, or cyclic structure. No particular limitation is imposed on the carbon atom number of the alkyl group, but the carbon atom number is preferably 40 or less, more preferably 30 or less, still more preferably 20 or less, much more preferably 10 or less.

Specific examples of the linear or branched alkyl group include, but are not limited to, methyl group, ethyl group, n-propyl group, isopropyl group, n-butyl group, isobutyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

Specific examples of the cyclic alkyl group include, but are not limited to, cycloalkyl groups, such as cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-isopropyl-cyclopropyl group, 2-isopropyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group; and bicycloalkyl groups, such as bicyclobutyl group, bicyclopentyl group, bicyclohexyl group, bicycloheptyl group, bicyclooctyl group, bicyclononyl group, and bicyclodecyl group.

The aryl group in Formula (1) may be a phenyl group, a monovalent group derived from a condensed-ring aromatic hydrocarbon compound through removal of one hydrogen atom, or a monovalent group derived from a linked-ring aromatic hydrocarbon compound through removal of one hydrogen atom. No particular limitation is imposed on the carbon atom number of the aryl group, but the carbon atom number is preferably 40 or less, more preferably 30 or less, still more preferably 20 or less.

Specific examples of the aryl group include, but are not limited to, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 5-naphthacenyl group, 2-chrysenyl group, 1-pyrenyl group, 2-pyrenyl group, pentacenyl group, benzopyrenyl group, triphenylenyl group, biphenyl-2-yl group, biphenyl-3-yl group, biphenyl-4-yl group, p-terphenyl-4-yl group, m-terphenyl-4-yl group, o-terphenyl-4-yl group, 1,1'-binaphthyl-2-yl group, and 2,2'-binaphthyl-1-yl group.

The aralkyl group in Formula (1) is an alkyl group substituted with an aryl group, and specific examples of the aryl group and the alkyl group are the same as those described above. No particular limitation is imposed on the carbon atom number of the aralkyl group, but the carbon atom number is preferably 40 or less, more preferably 30 or less, still more preferably 20 or less.

Specific examples of the aralkyl group include, but are not limited to, phenylmethyl group (benzyl group), 2-phenylethylene group, 3-phenyl-n-propyl group, 4-phenyl-n-butyl group, 5-phenyl-n-pentyl group, 6-phenyl-n-hexyl group, 7-phenyl-n-heptyl group, 8-phenyl-n-octyl group, 9-phenyl-n-nonyl group, and 10-phenyl-n-decyl group.

The halogenated alkyl group in Formula (1) is an alkyl group substituted with a halogen atom, and specific examples of the alkyl group are the same as those described above.

No particular limitation is imposed on the carbon atom number of the halogenated alkyl group, but the carbon atom number is preferably 40 or less, more preferably 30 or less, still more preferably 20 or less, much more preferably 10 or less.

Examples of the halogen atom and the halogen atom in Formula (1) include a fluorine atom, a chlorine atom, a bromine atom, and an iodine atom.

Specific examples of the halogenated alkyl group include, but are not limited to, monofluoromethyl group, difluoromethyl group, trifluoromethyl group, bromodifluoromethyl group, 2-chloroethyl group, 2-bromoethyl group, 1,1-difluoroethyl group, 2,2,2-trifluoroethyl group, 1,1,2,2-tetrafluoroethyl group, 2-chloro-1,1,2-trifluoroethyl group, pentafluoroethyl group, 3-bromopropyl group, 2,2,3,3-tetrafluoropropyl group, 1,1,2,3,3,3-hexafluoropropyl group, 1,1,1,3,3,3-hexafluoropropan-2-yl group, 3-bromo-2-methylpropyl group, 4-bromobutyl group, and perfluoropentyl group.

The halogenated aryl group in Formula (1) is an aryl group substituted with a halogen atom, and specific examples of the aryl group and the halogen atom are the same as those described above.

No particular limitation is imposed on the carbon atom number of the halogenated aryl group, but the carbon atom number is preferably 40 or less, more preferably 30 or less, still more preferably 20 or less.

Specific examples of the halogenated aryl group include, but are not limited to, 2-fluorophenyl group, 3-fluorophenyl group, 4-fluorophenyl group, 2,3-difluorophenyl group, 2,4-difluorophenyl group, 2,5-difluorophenyl group, 2,6-difluorophenyl group, 3,4-difluorophenyl group, 3,5-difluorophenyl group, 2,3,4-trifluorophenyl group, 2,3,5-trifluorophenyl group, 2,3,6-trifluorophenyl group, 2,4,5-trifluorophenyl group, 2,4,6-trifluorophenyl group, 3,4,5-trifluorophenyl group, 2,3,4,5-tetrafluorophenyl group, 2,3,4,6-tetrafluorophenyl group, 2,3,5,6-tetrafluorophenyl group, pentafluorophenyl group, 2-fluoro-1-naphthyl group, 3-fluoro-1-naphthyl group, 4-fluoro-1-naphthyl group, 6-fluoro-1-naphthyl group, 7-fluoro-1-naphthyl group, 8-fluoro-1-naphthyl group, 4,5-difluoro-1-naphthyl group, 5,7-difluoro-1-naphthyl group, 5,8-difluoro-1-naphthyl group, 5,6,7,8-tetrafluoro-1-naphthyl group, heptafluoro-1-naphthyl group, 1-fluoro-2-naphthyl group, 5-fluoro-2-naphthyl group, 6-fluoro-2-naphthyl group, 7-fluoro-2-naphthyl group, 5,7-difluoro-2-naphthyl group, and heptafluoro-2-naphthyl group.

The halogenated aralkyl group in Formula (1) is an aralkyl group substituted with a halogen atom, and specific examples of the aralkyl group and the halogen atom are the same as those described above.

No particular limitation is imposed on the carbon atom number of the halogenated aralkyl group, but the carbon atom number is preferably 40 or less, more preferably 30 or less, still more preferably 20 or less.

Specific examples of the halogenated aralkyl group include, but are not limited to, 2-fluorobenzyl group, 3-fluorobenzyl group, 4-fluorobenzyl group, 2,3-difluorobenzyl group, 2,4-difluorobenzyl group, 2,5-difluorobenzyl group, 2,6-difluorobenzyl group, 3,4-difluorobenzyl group, 3,5-difluorobenzyl group, 2,3,4-trifluorobenzyl group, 2,3,5-trifluorobenzyl group, 2,3,6-trifluorobenzyl group, 2,4,5-trifluorobenzyl group, 2,4,6-trifluorobenzyl group, 2,3,4,5-tetrafluorobenzyl group, 2,3,4,6-tetrafluorobenzyl group, 2,3,5,6-tetrafluorobenzyl group, and 2,3,4,5,6-pentafluorobenzyl group.

The alkoxyalkyl group in Formula (1) is an alkyl group substituted with an alkoxy group. In the alkoxyalkyl group, the alkyl group substituted with an alkoxy group may have a linear, branched, or cyclic structure. Specific examples of the alkyl group are the same as those described above. No particular limitation is imposed on the carbon atom number of the alkoxyalkyl group, but the carbon atom number is preferably 40 or less, more preferably 30 or less, still more preferably 20 or less, much more preferably 10 or less.

Specific examples of the alkoxy group substituted with the alkyl group in the alkoxyalkyl group and the alkoxy group in Formula (1) include, but are not limited to, linear or branched alkoxy groups, such as methoxy group, ethoxy group, n-propoxy group, isopropoxy group, n-butoxy group, isobutoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group; and cyclic alkoxy groups, such as cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-isopropyl-cyclopropoxy group, 2-isopropyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

Specific examples of the alkoxyalkyl group include, but are not limited to, lower alkyloxy lower alkyl groups, such as methoxymethyl group, ethoxymethyl group, 1-ethoxyethyl group, and 2-ethoxyethyl group.

The alkoxyaryl group in Formula (1) is an aryl group substituted with an alkoxy group, and specific examples of the alkoxy group and the aryl group are the same as those described above. No particular limitation is imposed on the carbon atom number of the alkoxyaryl group, but the carbon atom number is preferably 40 or less, more preferably 30 or less, still more preferably 20 or less.

Specific examples of the alkoxyaryl group include, but are not limited to, 2-methoxyphenyl group, 3-methoxyphenyl group, 4-methoxyphenyl group, 2-(1-ethoxy)phenyl group, 3-(1-ethoxy)phenyl group, 4-(1-ethoxy)phenyl group, 2-(2-ethoxy)phenyl group, 3-(2-ethoxy)phenyl group, 4-(2-ethoxy)phenyl group, 2-methoxynaphthalen-1-yl group, 3-methoxynaphthalen-1-yl group, 4-methoxynaphthalen-1-yl group, 5-methoxynaphthalen-1-yl group, 6-methoxynaphthalen-1-yl group, and 7-methoxynaphthalen-1-yl group.

The alkoxyaralkyl group in Formula (1) is an aralkyl group substituted with an alkoxy group, and specific examples of the alkoxy group and the aralkyl group are the same as those described above. No particular limitation is imposed on the carbon atom number of the alkoxyaralkyl group, but the carbon atom number is preferably 40 or less, more preferably 30 or less, still more preferably 20 or less.

Specific examples of the alkoxyaralkyl group include, but are not limited to, 3-(methoxyphenyl)benzyl group and 4-(methoxyphenyl)benzyl group.

The alkenyl group in Formula (1) may have a linear or branched structure. No particular limitation is imposed on the carbon atom number of the alkenyl group, but the carbon atom number is preferably 40 or less, more preferably 30 or less, still more preferably 20 or less, much more preferably 10 or less.

Specific examples of the alkenyl group include, but are not limited to, ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-isopropylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-isobutylethenyl group, 2,2-dimethyl-3-butenyl group, 2,3-dimethyl-1-butenyl group, 2,3-dimethyl-2-butenyl group, 2,3-dimethyl-3-butenyl group, 2-isopropyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-isopropyl-1-propenyl group, 1-isopropyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the organic group containing an epoxy group in Formula (1) include, but are not limited to, glycidoxymethyl group, glycidoxyethyl group, glycidoxypropyl group, glycidoxybutyl group, and epoxycyclohexyl group.

Examples of the organic group containing an acryloyl group in Formula (1) include, but are not limited to, acryloylmethyl group, acryloylethyl group, and acryloylpropyl group.

Examples of the organic group containing a methacryloyl group in Formula (1) include, but are not limited to, methacryloylmethyl group, methacryloylethyl group, and methacryloylpropyl group.

Examples of the organic group containing a mercapto group in Formula (1) include, but are not limited to, ethylmercapto group, butylmercapto group, hexylmercapto group, and octylmercapto group.

Examples of the organic group containing a cyano group in Formula (1) include, but are not limited to, cyanoethyl group and cyanopropyl group.

The aralkyloxy group in Formula (1) is a group derived from an aralkyl alcohol through removal of a hydrogen atom from the hydroxy group of the alcohol. Specific examples of the aralkyl group are the same as those described above.

No particular limitation is imposed on the carbon atom number of the aralkyloxy group, but the carbon atom number is preferably 40 or less, more preferably 30 or less, still more preferably 20 or less.

Specific examples of the aralkyloxy group include, but are not limited to, phenylmethyloxy group (benzyloxy group), 2-phenylethyleneoxy group, 3-phenyl-n-propyloxy group, 4-phenyl-n-butyloxy group, 5-phenyl-n-pentyloxy group, 6-phenyl-n-hexyloxy group, 7-phenyl-n-heptyloxy group, 8-phenyl-n-octyloxy group, 9-phenyl-n-nonyloxy group, and 10-phenyl-n-decyloxy group.

The acyloxy group in Formula (1) is a group derived from a carboxylic compound through removal of a hydrogen atom from the carboxy group of the compound. Typical examples of the acyloxy group include, but are not limited to, an alkylcarbonyloxy group, an arylcarbonyloxy group, or an aralkylcarbonyloxy group, which is respectively derived from an alkylcarboxylic acid, an arylcarboxylic acid, or an aralkylcarboxylic acid through removal of a hydrogen atom from the carboxy group of the acid. Specific examples of the alkyl group, the aryl group, and the aralkyl group of such alkylcarboxylic acid, arylcarboxylic acid, and aralkylcarboxylic acid are the same as those described above.

Specific examples of the acyloxy group include, but are not limited to, methylcarbonyloxy group, ethylcarbonyloxy group, n-propylcarbonyloxy group, isopropylcarbonyloxy group, n-butylcarbonyloxy group, isobutylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

No particular limitation is imposed on the organic group containing an amino group in Formula (1), so long as it is an organic group containing an amino group. One preferred example of the organic group is a group of the following Formula (A1).

(A1)

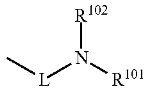

In Formula (A1), $R^{101}$ and $R^{102}$ are each independently a hydrogen atom or a hydrocarbon group, and L is each independently a substitutable alkylene group.

Examples of the hydrocarbon group in Formula (A1) include, but are not limited to, alkyl group, alkenyl group, and aryl group.

Specific examples of the alkyl group, the alkenyl group, and the aryl group are the same as those described above.

From the viewpoint of achieving excellent lithographic property at high reproducibility, each of $R^{101}$ and $R^{102}$ is preferably a hydrogen atom, an alkyl group, or an aryl group, more preferably a hydrogen atom, a $C_{1-5}$ alkyl group, or a $C_{6-10}$ aryl group. Still more preferably $R^{101}$ is a hydrogen atom, and $R^{102}$ is a hydrogen atom, a $C_{1-5}$ alkyl group, or a $C_{6-10}$ aryl group, or each of $R^{101}$ and $R^{102}$ is a $C_{1-5}$ alkyl group or a $C_{6-10}$ aryl group. Much more preferably, each of $R^{101}$ and $R^{102}$ is a hydrogen atom.

Examples of the alkylene group in Formula (A1) are the same as those described above. The alkylene group may have a linear or branched structure, and the carbon atom number of the alkylene group is generally 1 to 10, preferably 1 to 5.

In particular, the alkylene group is preferably a linear alkylene group, such as methylene group, ethylene group, trimethylene group, tetramethylene group, pentamethylene group, hexamethylene group, heptamethylene group, octamethylene group, nonamethylene group, or decamethylene group.

In Formula (1), a is an integer of 1 or 2; b is an integer of 0 or 1; and a and b satisfy a relation of $a+b \leq 2$. Preferably, b is 0, more preferably a is 1 and b is 0, from the viewpoints of, for example, the balance between excellent lithographic property, resistance to a solvent in a composition for a resist film, and suitable etching rate.

No limitation is imposed on the amount of the amino-group-containing silane of Formula (1) contained in the aforementioned hydrolyzable silane compound. From the viewpoint of achieving excellent lithographic property at high reproducibility, the hydrolyzable silane compound contains the amino-group-containing silane of Formula (1) in an amount of preferably 0.01% by mole to 20% by mole, more preferably 0.1% by mole to 5% by mole (balance: additional hydrolyzable silane).

In the film-forming composition of the present invention, the aforementioned hydrolyzable silane compound may contain, as an additional hydrolyzable silane, at least one selected from among, for example, a hydrolyzable silane of the following Formula (2) and a hydrolyzable silane of the following Formula (3) together with the amino-group-containing silane of Formula (1) for the purpose of, for example, adjusting film properties such as film density.

$$R^4_dSi(R^5)_{4-d} \quad (2)$$

$$[R^6_eSi(R^7)_{3-e}]_2Y_f \quad (3)$$

In Formula (2), $R^4$ is a group bonded to the silicon atom via an Si—C bond, and is each independently a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, an amide group, an alkoxy group, or a sulfonyl group, or any combination of these.

$R^5$ is a group or atom bonded to the silicon atom, and is each independently an alkoxy group, an aralkyloxy group, an acyloxy group, or a halogen atom.

In Formula (2), d is an integer of 0 to 3.

Specific examples of the groups and atoms of $R^4$ and the preferred carbon atom number thereof are the same as those described above in $R^2$.

Specific examples of the groups and atoms of $R^5$ and the preferred carbon atom number thereof are the same as those described above in $R^3$.

In Formula (3), $R^6$ is a group bonded to the silicon atom via an Si—C bond, and is each independently a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, an amide group, an alkoxy group, or a sulfonyl group, or any combination of these.

$R^7$ is a group or atom bonded to the silicon atom, and is each independently an alkoxy group, an aralkyloxy group, an acyloxy group, or a halogen atom.

Y is a group bonded to the silicon atom via an Si—C bond, and is each independently an alkylene group or an arylene group.

In Formula (3), e is an integer of 0 or 1, and f is an integer of 0 or 1.

Specific examples of the groups and atoms of $R^6$ and $R^7$ and the preferred carbon atom number thereof are the same as those described above.

Specific examples of the alkylene group of Y include, but are not limited to, alkylene groups, for example, linear alkylene groups such as methylene group, ethylene group, trimethylene group, tetramethylene group, pentamethylene group, hexamethylene group, heptamethylene group, octamethylene group, nonamethylene group, and decamethylene group, and branched alkylene groups such as 1-methyltrimethylene group, 2-methyltrimethylene group, 1,1-dimethylethylene group, 1-methyltetramethylene group, 2-methyltetramethylene group, 1,1-dimethyltrimethylene group, 1,2-dimethyltrimethylene group, 2,2-dimethyltrimethylene group, and 1-ethyltrimethylene group; and alkanetriyl groups such as methanetriyl group, ethane-1,1,2-triyl group, ethane-1,2,2-triyl group, ethane-2,2,2-triyl group, propane-1,1,1-triyl group, propane-1,1,2-triyl group, propane-1,2,3-triyl group, propane-1,2,2-triyl group, propane-1,1,3-triyl group, butane-1,1,1-triyl group, butane-1,1,2-triyl group, butane-1,1,3-triyl group, butane-1,2,3-triyl group, butane-1,2,4-triyl group, butane-1,2,2-triyl group, butane-2,2,3-triyl group, 2-methylpropane-1,1,1-triyl group, 2-methylpropane-1,1,2-triyl group, and 2-methylpropane-1,1,3-triyl group.

Specific examples of the arylene group of Y include, but are not limited to, 1,2-phenylene group, 1,3-phenylene group, 1,4-phenylene group; groups derived from a condensed-ring aromatic hydrocarbon compound through removal of two hydrogen atoms on the aromatic ring, such as 1,5-naphthalenediyl group, 1,8-naphthalenediyl group, 2,6-naphthalenediyl group, 2,7-naphthalenediyl group, 1,2-anthracenediyl group, 1,3-anthracenediyl group, 1,4-anthracenediyl group, 1,5-anthracenediyl group, 1,6-anthracenediyl group, 1,7-anthracenediyl group, 1,8-anthracenediyl group, 2,3-anthracenediyl group, 2,6-anthracenediyl group, 2,7-anthracenediyl group, 2,9-anthracenediyl group, 2,10-anthracenediyl group, and 9,10-anthracenediyl group; and groups derived from a linked-ring aromatic hydrocarbon compound through removal of two hydrogen atoms on the aromatic ring, such as 4,4'-biphenyldiyl group and 4,4"-p-terphenyldiyl group.

In Formula (3), e is preferably 0 or 1, more preferably 0, and f is preferably 1.

Specific examples of the hydrolyzable silane of Formula (2) include, but are not limited to, tetramethoxysilane, tetrachlorosilane, tetraacetoxysilane, tetraethoxysilane, tetra-n-propoxysilane, tetra-i-propoxysilane, tetra-n-butoxysilane, methyltrimethoxysilane, methyltrichlorosilane, methyltriacetoxysilane, methyltripropoxysilane, methyltributoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltrichlorosilane, vinyltriacetoxysilane, vinyltriethoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, methoxybenzyltriacetoxysilane, methoxybenzyltrichlorosilane, methoxyphenethyltrimethoxysilane, methoxyphenethyltriethoxysilane, methoxyphenethyltriacetoxysilane, methoxyphenethyltrichlorosilane, ethoxyphenyltrimethoxysilane, ethoxyphenyltriethoxysilane, ethoxyphenyltriacetoxysilane, ethoxyphenyltrichlorosilane, ethoxybenzyltrimethoxysilane, ethoxybenzyltriethoxysilane, ethoxybenzyltriacetoxysilane, ethoxybenzyltrichlorosilane, i-propoxyphenyltrimethoxysilane, i-propoxyphenyltriethoxysilane, i-propoxyphenyltriacetoxysilane, i-propoxyphenyltrichlorosilane, i-propoxybenzyltrimethoxysilane, i-propoxybenzyltriethoxysilane, i-propoxybenzyltriacetoxysilane, i-propoxybenzyltrichlorosilane, t-butoxyphenyltrimethoxysilane, t-butoxyphenyltriethoxysilane, t-butoxyphenyltriacetoxysilane, t-butoxyphenyltrichlorosilane, t-butoxybenzyltrimethoxysilane, t-butoxybenzyltriethoxysilane, t-butoxybenzyltriacetoxysilane, t-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, chloromethyltrimethoxysilane, chloromethyltriethoxysilane, triethoxysilylpropyldiallyl isocyanurate, bicyclo(2,2,1)heptenyltriethoxysilane, benzenesulfonylpropyltriethoxysilane, benzenesulfonamidepropyltriethoxysilane, dimethylaminopropyltrimethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptopropylmethyldiethoxysilane, methylvinyldimethoxysilane, methylvinyldiethoxysilane, and silanes of the following Formulae (A-1) to (A-41).

Formula (A-1)

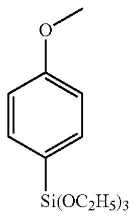

-continued

Formula (A-2)

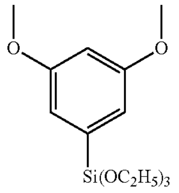

Formula (A-3)

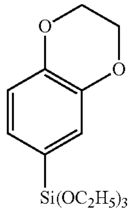

Formula (A-4)

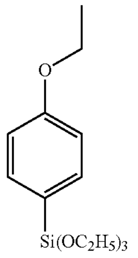

Formula (A-5)

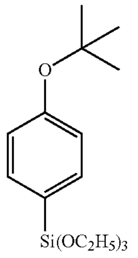

Formula (A-6)

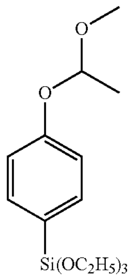

Formula (A-7)

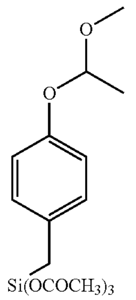

-continued
Formula (A-8)
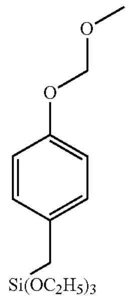
Formula (A-9)
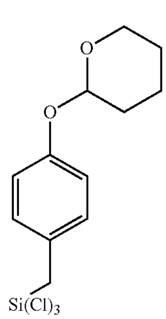
Formula (A-10)
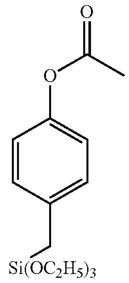
Formula (A-11)
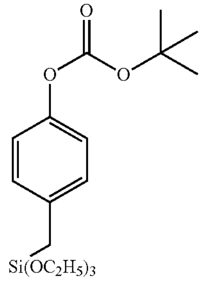
Formula (A-12)
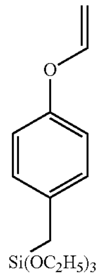
-continued
Formula (A-13)
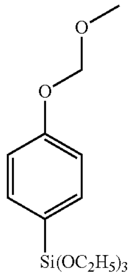
Formula (A-14)
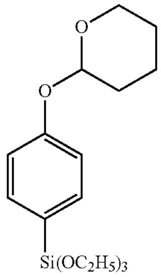
Formula (A-15)
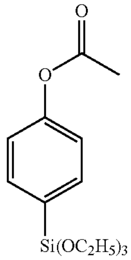
Formula (A-16)
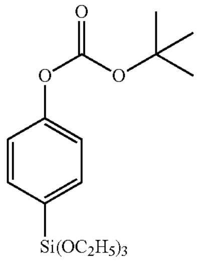
Formula (A-17)
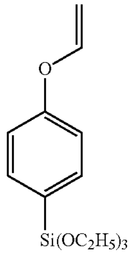
Formula (A-18)
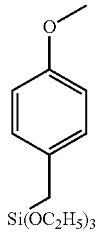

-continued
Formula (A-19)
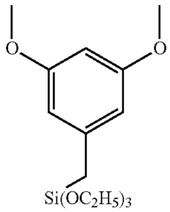
Formula (A-20)
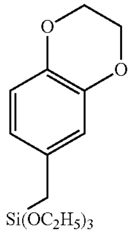
Formula (A-21)
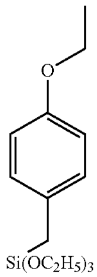
Formula (A-22)
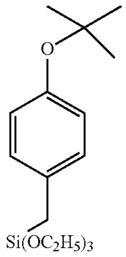
Formula (A-23)
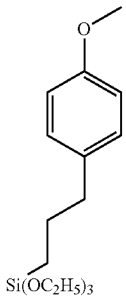
Formula (A-24)
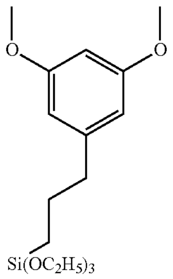
-continued
Formula (A-25)
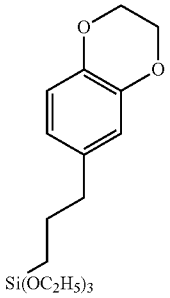
Formula (A-26)
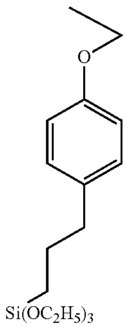
Formula (A-27)
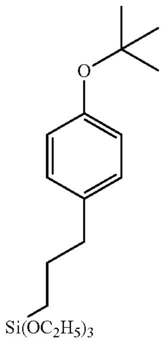
Formula (A-28)
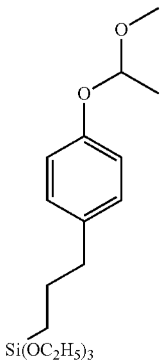

-continued
Formula (A-29)
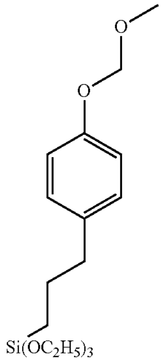
Formula (A-30)
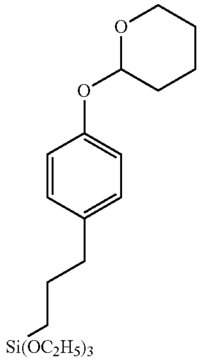
Formula (A-31)
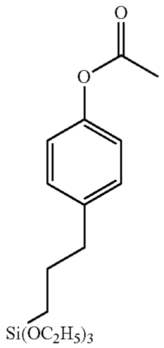
Formula (A-32)
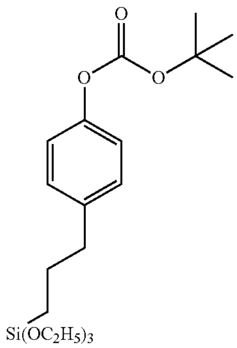
-continued
Formula (A-33)
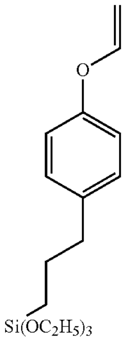
Formula (A-34)
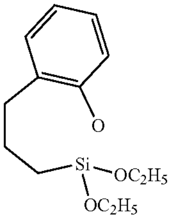
Formula (A-35)
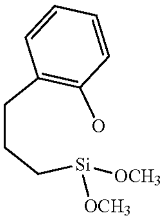
Formula (A-36)
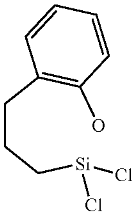
Formula (A-37)
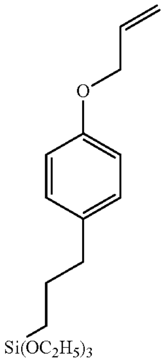

-continued

Formula (A-38)

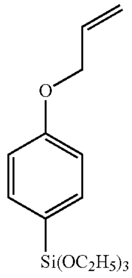

Formula (A-39)

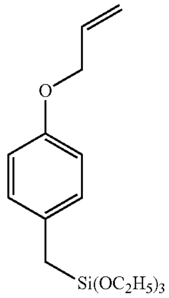

Formula (A-40)

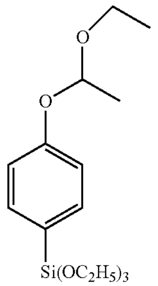

Formula (A-41)

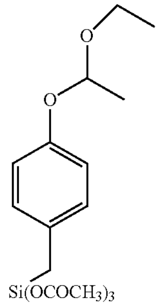

Specific examples of the hydrolyzable silane of Formula (3) include, but are not limited to, methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

In the present invention, when the aforementioned hydrolyzable silane compound for providing a hydrolysis condensate contains an additional hydrolyzable silane other than the amino-group-containing silane of Formula (1), the amount of the additional hydrolyzable silane contained in the hydrolyzable silane compound is generally 80% by mole to 99.99% by mole, preferably 95% by mole to 99.9% by mole.

From the viewpoints of, for example, increasing the crosslinked density of a film formed from the film-forming composition of the present invention, reducing diffusion, etc. of a component of a resist film into the film formed from the composition, and maintaining and improving the resist properties of the resist film, the aforementioned hydrolyzable silane compound contains preferably a hydrolyzable silane of Formula (2), more preferably a trifunctional hydrolyzable silane of Formula (2) and a tetrafunctional hydrolyzable silane of Formula (2), still more preferably at least one selected from among an alkyltrialkoxysilane and an aryltrialkoxysilane and tetraalkoxysilane, much more preferably at least one selected from among methyltrialkoxysilane and phenyltrialkoxysilane and tetraalkoxysilane.

In this case, the ratio by mole of the trifunctional hydrolyzable silane of Formula (2) to the tetrafunctional hydrolyzable silane of Formula (2) is generally 10:90 to 90:10, preferably 70:30 to 20:80.

An acidic compound containing two or more acidic groups is used for hydrolysis and condensation of the aforementioned hydrolyzable silane compound for forming a hydrolysis condensate contained in the film-forming composition of the present invention.

No particular limitation is imposed on the acidic compound containing two or more acidic groups, so long as the compound contains two or more acidic groups having mutually different structures. The acidic compound may be an inorganic acid or an organic acid.

Typical examples of the acidic compound containing two or more acidic groups include, but are not limited to, a compound containing an aromatic ring such as a benzene ring and two or more acidic groups. The acidic compound is preferably a compound having a structure wherein at least one of two or more acidic groups is directly bonded to an aromatic ring such as a benzene ring, more preferably a compound having a structure wherein all of two or more acidic groups are directly bonded to an aromatic ring such as a benzene ring.

In a preferred embodiment of the present invention, the two or more acidic groups contain two or more groups selected from the group consisting of a sulfonate group, a phosphate group, a carboxy group, and a phenolic hydroxy group. In a more preferred embodiment, the two or more acidic groups contain at least one selected from the group consisting of a sulfonate group, a phosphate group, a carboxy group, and a phenolic hydroxy group, and at least one selected from the group consisting of a carboxy group and a phenolic hydroxy group.

Examples of preferred combinations of the two or more acidic groups include, but are not limited to, a sulfonate group and a phenolic hydroxy group; a sulfonate group and a carboxy group; a sulfonate group, a carboxy group, and a phenolic hydroxy group; a phosphate group and a phenolic hydroxy group; a phosphate group and a carboxy group; a phosphate group, a carboxy group, and a phenolic hydroxy group; and a carboxy group and a phenolic hydroxy group.

The number of types of the two or more acidic groups is two or more. From the viewpoints of achieving favorable lithographic property at high reproducibility and easy availability of the compound, the number of the types is generally two to five, preferably two to four, more preferably two or three.

The number of the two or more acidic groups is two or more. From the viewpoints of achieving favorable lithographic property at high reproducibility and easy availability of the compound, the number of the acidic groups is generally two to five, preferably two to four, more preferably two or three.

A preferred example of the aforementioned acidic compound includes, but are not limited to, an acidic compound of the following Formula (S):

$$(R^A)_q\text{—Ar—}(R^S)_r \quad (S)$$

(wherein Ar is a $C_{6-20}$ aromatic ring, such as a benzene ring or a naphthalene ring; $R^A$ is an acidic group; $R^S$ is each independently a substituent, such as a halogen atom, a nitro group, a cyano group, or a $C_{1-10}$ alkyl group (e.g., a methyl group or an ethyl group); q is the number of acidic groups bonded to the aromatic ring, and is an integer of 2 to 5; r is the number of substituents bonded to the aromatic ring, and is an integer of 0 to 3; q $R^A$s are mutually different groups; and r $R^S{}_S$ may be identical to or different from one another).

Specific examples of the acidic compound containing two or more acidic groups include, but are not limited to, o-phenolsulfonic acid, m-phenolsulfonic acid, p-phenolsulfonic acid, 3-sulfosalicylic acid, 4-sulfosalicylic acid, 5-sulfosalicylic acid, 6-sulfosalicylic acid, o-phosphonobenzoic acid, m-phosphonobenzoic acid, p-phosphonobenzoic acid, 2-hydroxybenzoic acid, 3-hydroxybenzoic acid, 4-hydroxybenzoic acid, o-hydroxyphenylphosphonic acid, m-hydroxyphenylphosphonic acid, and p-hydroxyphenylphosphonic acid.

The hydrolysis condensate contained in the film-forming composition of the present invention is prepared through hydrolysis and condensation of the above-described hydrolyzable silane compound containing an amino-group-containing silane of Formula (1) by using the aforementioned acidic compound. Since the amino-group-containing silane and the acidic compound containing two or more acidic groups are used, the monomer unit derived from the amino-group-containing silane in the hydrolysis condensate can contain two or more amine salt structures. This results in achievement of resistance to a solvent in a composition for forming a resist film serving as an upper layer, favorable etching property to a fluorine-containing gas, and favorable lithographic property.

In particular, a carboxy group or a phenolic hydroxy group can contribute to an improvement in lithographic property, and a sulfonate group or a phosphate group can contribute to improvements in etching property to a fluorine-containing gas and wet etching property.

The film-forming composition of the present invention contains a solvent.

No limitation is imposed on the solvent, so long as it dissolves the hydrolyzable silane described above and below, the hydrolysis condensate of the silane, or an additional component.

Specific examples of the solvent include methylcellosolve acetate, ethylcellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. These solvents may be used alone or in combination of two or more species.

The film-forming composition of the present invention may contain water as a solvent. The amount of water is preferably 30% by mass or less, more preferably 20% by mass or less, still more preferably 15% by mass or less, relative to the solvents contained in the composition.

In the present invention, the aforementioned hydrolyzable silane may contain a hydrolyzable organosilane having an onium group in the molecule. The use of a hydrolyzable organosilane having an onium group in the molecule can effectively and efficiently promote the crosslinking reaction of the hydrolyzable silane.

One preferred example of such a hydrolyzable organosilane having an onium group in the molecule is shown in the following Formula (4).

$$R^{31}{}_jR^{32}{}_kSi(R^{33})_{4-(j+k)} \quad (4)$$

$R^{31}$ is a group bonded to the silicon atom, and is each independently an onium group or an organic group containing the onium group; $R^{32}$ is a group bonded to the silicon atom, and is a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, an amino group, or a cyano group; $R^{33}$ is each independently a group or atom bonded to the silicon atom, and is an alkoxy group, an aralkyloxy group, an acyloxy group, or a halogen atom; j is 1 or 2; k is 0 or 1; and j and k satisfy a relation of $1 \le j+k \le 2$.

Specific examples of the aforementioned alkyl group, aryl group, aralkyl group, halogenated alkyl group, halogenated aryl group, halogenated aralkyl group, alkoxyalkyl group, alkoxyaryl group, alkoxyaralkyl group, alkenyl group, alkoxy group, halogen atom, and organic group containing an epoxy group, an acryloyl group, a methacryloyl group, a mercapto group, an amino group, or a cyano group, and the substituent of the alkyl group, the aryl group, the aralkyl group, the halogenated alkyl group, the halogenated aryl group, the halogenated aralkyl group, the alkoxyalkyl group, the alkoxyaryl group, the alkoxyaralkyl group, and the alkenyl group, and preferred carbon atom numbers thereof are the same as those described above.

More specifically, the onium group is, for example, a cyclic ammonium group or a chain ammonium group, and is preferably a tertiary ammonium group or a quaternary ammonium group.

Preferred specific examples of the onium group or the organic group containing the onium group include a cyclic ammonium group or a chain ammonium group, or an organic group containing at least one of these ammonium groups. Preferred is a tertiary ammonium group or a quaternary ammonium group, or an organic group containing at least one of these ammonium groups When the onium group is a cyclic ammonium group, the nitrogen atom forming the ammonium group also serves as an atom forming the ring. In this case, the nitrogen atom forming the ring and the silicon atom are bonded directly or via a divalent linking group, or the carbon atom forming the ring and the silicon atom are bonded directly or via a divalent linking group.

In one preferred embodiment of the present invention, $R^{31}$ is a heteroaromatic cyclic ammonium group of the following Formula (S1).

(S1)

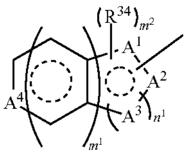

$A^1$, $A^2$, $A^3$, and $A^4$ are each independently a group of any of the following Formulae (J1) to (J3), and at least one of $A^1$ to $A^4$ is a group of the following Formula (J2). Depending on the bonding between the silicon atom in Formula (4) and any of $A^1$ to $A^4$, each of $A^1$ to $A^4$ and the ring-forming atom adjacent thereto forms a single bond or a double bond. This determines whether the thus-formed ring exhibits aromaticity.

(J1)

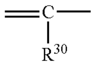

(J2)

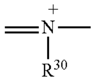

(J3)

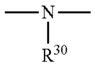

$R^{30}$ is each independently a single bond, a hydrogen atom, an alkyl group, an aryl group, an aralkyl group, a halogenated alkyl group, a halogenated aryl group, a halogenated aralkyl group, or an alkenyl group. Specific examples of the alkyl group, the aryl group, the aralkyl group, the halogenated alkyl group, the halogenated aryl group, the halogenated aralkyl group, and the alkenyl group, and preferred carbon atom numbers thereof are the same as those described above.

$R^{34}$ is each independently an alkyl group, an aryl group, an aralkyl group, a halogenated alkyl group, a halogenated aryl group, a halogenated aralkyl group, an alkenyl group, or a hydroxy group. When two or more $R^{34}$s are present, the two $R^{34}$s may be bonded together to form a ring, and the ring formed by the two $R^{34}$s may have a crosslinked ring structure. In such a case, the cyclic ammonium group has, for example, an adamantane ring, a norbornene ring, or a spiro ring.

Specific examples of these alkyl group, aryl group, aralkyl group, halogenated alkyl group, halogenated aryl group, halogenated aralkyl group, and alkenyl group, and preferred carbon atom numbers thereof are the same as those described above.

In Formula (S1), n is an integer of 1 to 8; m is 0 or 1; and $m^2$ is 0 or a positive integer ranging from 1 to the possible maximum number of $R^{34}$s substituted on a monocyclic or polycyclic ring.

When $m^1$ is 0, a $(4+n^1)$-membered ring including $A^1$ to $A^4$ is formed. Specifically, when $n^1$ is 1, a 5-membered ring is formed; when $n^1$ is 2, a 6-membered ring is formed; when $n^1$ is 3, a 7-membered ring is formed; when $n^1$ is 4, a 8-membered ring is formed; when $n^1$ is 5, a 9-membered ring is formed; when $n^1$ is 6, a 10-membered ring is formed; when $n^1$ is 7, a 11-membered ring is formed; and when $n^1$ is 8, a 12-membered ring is formed.

When $m^1$ is 1, a condensed ring is formed by condensation between a $(4+n^1)$-membered ring including $A^1$ to $A^3$ and a 6-membered ring including $A^4$.

Since each of $A^1$ to $A^4$ is any of the groups of Formulae (J1) to (J3), the ring-forming atom has or does not have a hydrogen atom. In each of $A^1$ to $A^4$, when the ring-forming atom has a hydrogen atom, the hydrogen atom may be substituted with $R^{34}$. Alternatively, a ring-forming atom other than the ring-forming atom in each of $A^1$ to $A^4$ may be substituted with $R^{34}$. Because of these circumstances, $m^2$ is 0 or an integer ranging from 1 to the possible maximum number of $R^{34}$s substituted on a monocyclic or polycyclic ring.

The dangling bond of the heteroaromatic cyclic ammonium group of Formula (S1) is present on any carbon atom or nitrogen atom presents in such a monocyclic or polycyclic ring, and is directly bonded to the silicon atom. Alternatively, the dangling bond is bonded to a linking group to form an organic group containing the cyclic ammonium group, and the organic group is bonded to the silicon atom.

Examples of the linking group include, but are not limited to, an alkylene group, an arylene group, and an alkenylene group.

Specific examples of the alkylene group and the arylene group, and preferred carbon atom numbers thereof are the same as those described above.

The alkenylene group is a divalent group derived from an alkenyl group through removal of one hydrogen atom. Specific examples of the alkenyl group are the same as those described above.

No particular limitation is imposed on the carbon atom number of the alkenylene group, but the carbon atom number is preferably 40 or less, more preferably 30 or less, still more preferably 20 or less.

Specific examples of the alkenylene group include, but are not limited to, vinylene group, 1-methylvinylene group, propenylene group, 1-butenylene group, 2-butenylene group, 1-pentenylene group, and 2-pentenylene group.

Specific examples of the hydrolyzable organosilane of Formula (4) having the heteroaromatic cyclic ammonium group of Formula (S1) include, but are not limited to, those described below.

Formula (I-1)

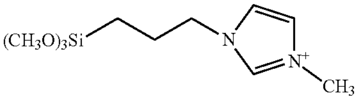

Formula (I-2)

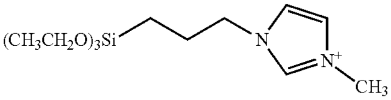

Formula (I-3)

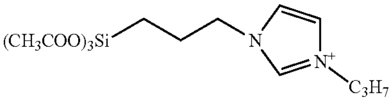

Formula (I-4)

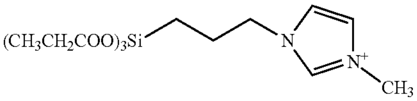

Formula (I-5)

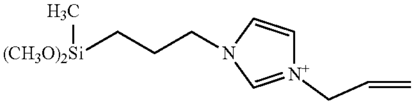

Formula (I-6)

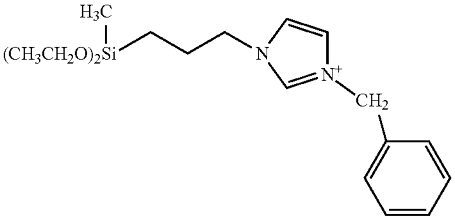

Formula (I-7)

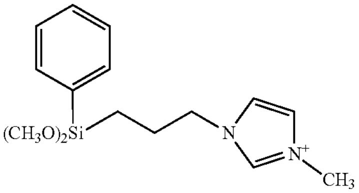

Formula (I-8)

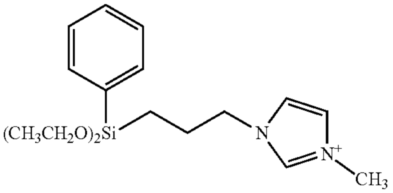

Formula (I-9)

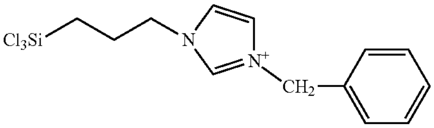

-continued

Formula (I-10)

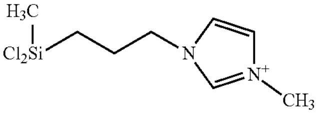

Formula (I-11)

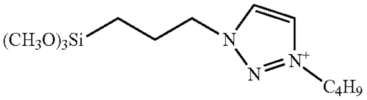

Formula (I-12)

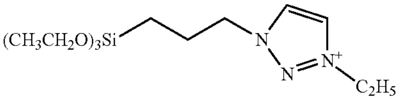

Formula (I-13)

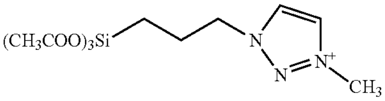

Formula (I-14)

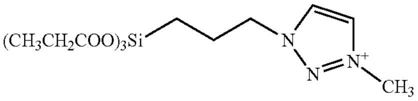

Formula (I-15)

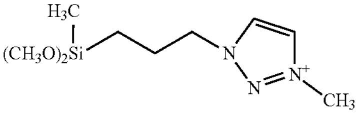

Formula (I-16)

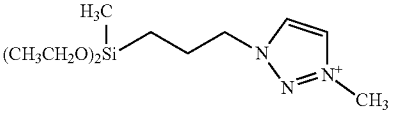

Formula (I-17)

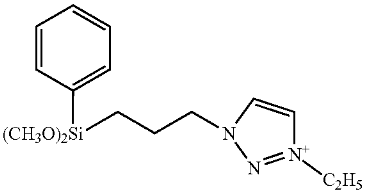

Formula (I-18)

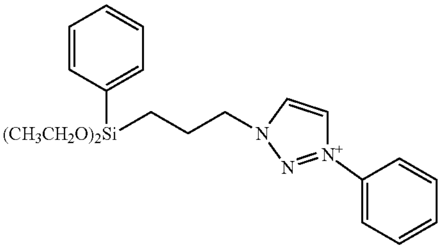

Formula (I-19)

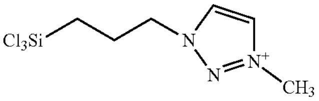

Formula (I-20)

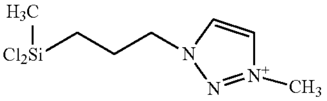

-continued
Formula (I-21)
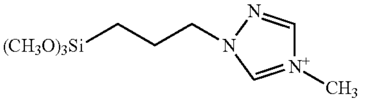
Formula (I-22)
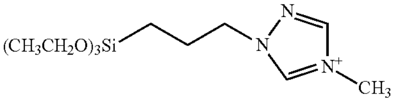
Formula (I-23)
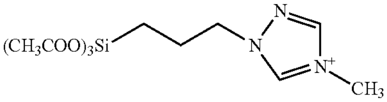
Formula (I-24)
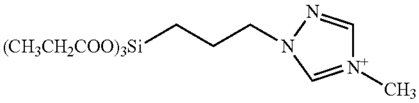
Formula (I-25)
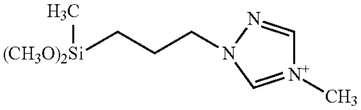
Formula (I-26)
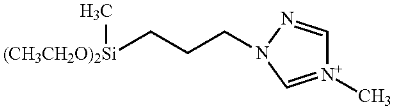
Formula (I-27)
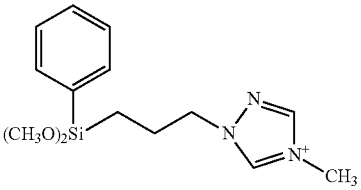
Formula (I-28)
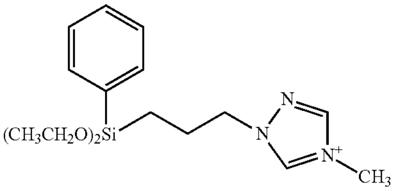
Formula (I-29)
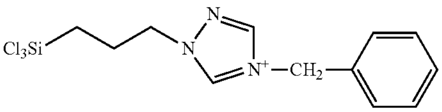
Formula (I-30)
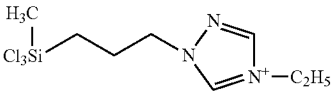
Formula (I-31)
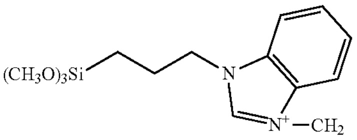
-continued
Formula (I-32)
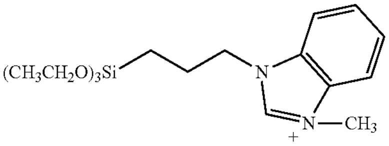
Formula (I-33)
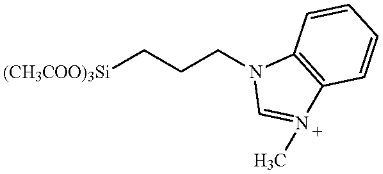
Formula (I-34)
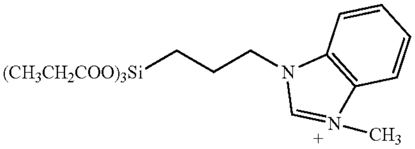
Formula (I-35)
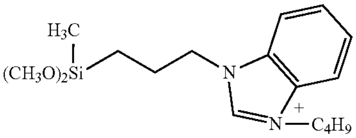
Formula (I-36)
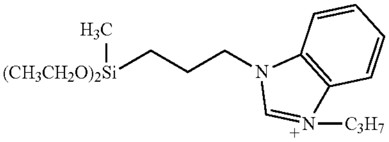
Formula (I-37)
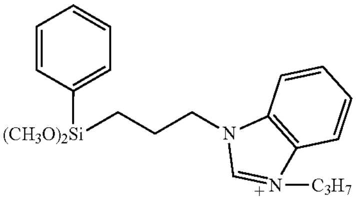
Formula (I-38)
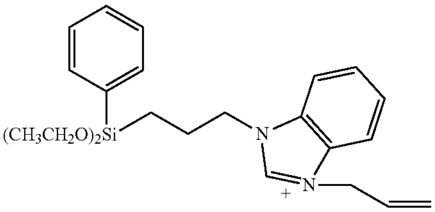
Formula (I-39)
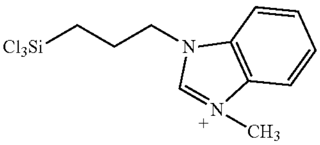
Formula (I-40)
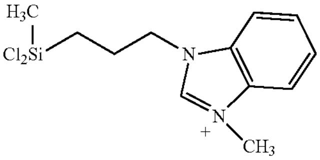

-continued

Formula (I-71)

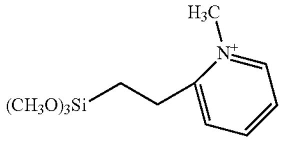

Formula (I-72)

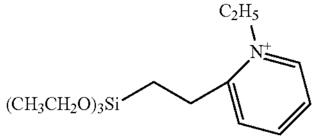

Formula (I-73)

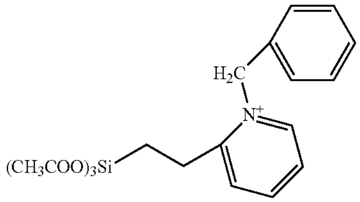

Formula (I-74)

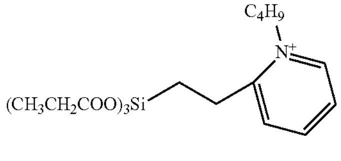

Formula (I-75)

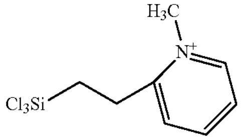

Formula (I-76)

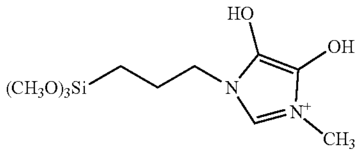

Formula (I-77)

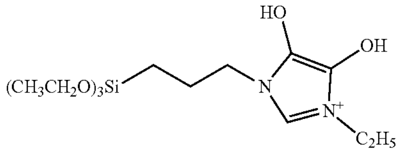

Formula (I-78)

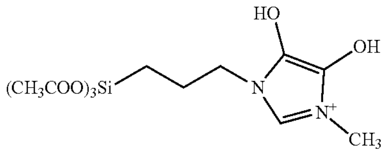

Formula (I-79)

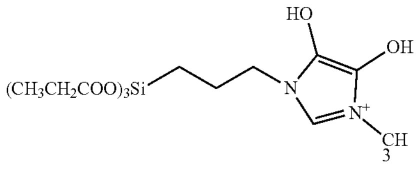

-continued

Formula (I-80)

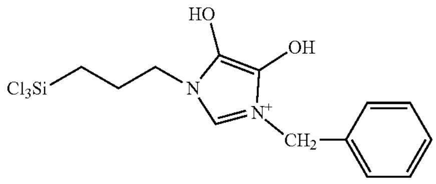

In another preferred embodiment of the present invention, $R^{31}$ is a heteroaliphatic cyclic ammonium group of the following Formula (S2).

(S2)

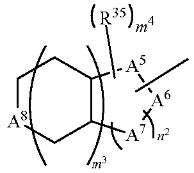

$A^5$, $A^6$, $A^7$, and $A^8$ are each independently a group of any of the following Formulae (J4) to (J6), and at least one of $A^5$ to $A^8$ is a group of the following Formula (J5). Depending on the bonding between the silicon atom in Formula (4) and any of $A^5$ to $A^8$, each of $A^5$ to $A^8$ and the ring-forming atom adjacent thereto forms a single bond or a double bond. This determines whether the thus-formed ring exhibits anti-aromaticity.

(J4)

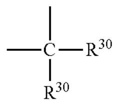

(J5)

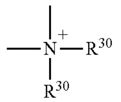

(J6)

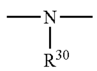

$R^{30}$ is each independently a single bond, a hydrogen atom, an alkyl group, an aryl group, an aralkyl group, a halogenated alkyl group, a halogenated aryl group, a halogenated aralkyl group, or an alkenyl group. Specific examples of the alkyl group, the aryl group, the aralkyl group, the halogenated alkyl group, the halogenated aryl group, the halogenated aralkyl group, and the alkenyl group, and preferred carbon atom numbers thereof are the same as those described above.

$R^{35}$ is each independently an alkyl group, an aryl group, an aralkyl group, a halogenated alkyl group, a halogenated aryl group, a halogenated aralkyl group, an alkenyl group, or a hydroxy group. When two or more $R^{35}$s are present, the two $R^{35}$s may be bonded together to form a ring, and the ring formed by the two $R^{35}$s may have a crosslinked ring structure. In such a case, the cyclic ammonium group has, for example, an adamantane ring, a norbornene ring, or a spiro ring.

Specific examples of the alkyl group, the aryl group, the aralkyl group, the halogenated alkyl group, the halogenated aryl group, the halogenated aralkyl group, and the alkenyl group, and preferred carbon atom numbers thereof are the same as those described above.

In Formula (S2), $n^2$ is an integer of 1 to 8; $m^3$ is 0 or 1; and $m^4$ is 0 or a positive integer ranging from 1 to the possible maximum number of $R^{35}$s substituted on a monocyclic or polycyclic ring.

When $m^3$ is 0, a $(4+n^2)$-membered ring including $A^5$ to $A^8$ is formed. Specifically, when $n^2$ is 1, a 5-membered ring is formed; when $n^2$ is 2, a 6-membered ring is formed; when $n^2$ is 3, a 7-membered ring is formed; when $n^2$ is 4, a 8-membered ring is formed; when $n^2$ is 5, a 9-membered ring is formed; when $n^2$ is 6, a 10-membered ring is formed; when $n^2$ is 7, a 11-membered ring is formed; and when $n^2$ is 8, a 12-membered ring is formed.

When $m^3$ is 1, a condensed ring is formed by condensation between a $(4+n^2)$-membered ring including $A^5$ to $A^7$ and a 6-membered ring including $A^8$.

Since each of $A^5$ to $A^8$ is any of the groups of Formulae (J4) to (J6), the ring-forming atom has or does not have a hydrogen atom. In each of $A^5$ to $A^8$, when the ring-forming atom has a hydrogen atom, the hydrogen atom may be substituted with $R^{35}$. Alternatively, a ring-forming atom other than the ring-forming atom in each of $A^5$ to $A^8$ may be substituted with $R^{35}$.

Because of these circumstances, $m^4$ is 0 or an integer ranging from 1 to the possible maximum number of $R^{35}$s substituted on a monocyclic or polycyclic ring.

The dangling bond of the heteroaliphatic cyclic ammonium group of Formula (S2) is present on any carbon atom or nitrogen atom presents in such a monocyclic or polycyclic ring, and is directly bonded to the silicon atom. Alternatively, the dangling bond is bonded to a linking group to form an organic group containing the cyclic ammonium group, and the organic group is bonded to the silicon atom.

The linking group is, for example, an alkylene group, an arylene group, or an alkenylene group. Specific examples of the alkylene group, the arylene group, and the alkenylene group, and preferred carbon atom numbers thereof are the same as those described above.

Specific examples of the hydrolyzable organosilane of Formula (4) having the heteroaliphatic cyclic ammonium group of Formula (S2) include, but are not limited to, those described below.

Formula (II-1)

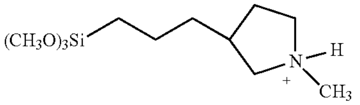

Formula (II-2)

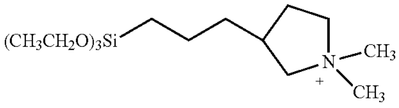

Formula (II-3)

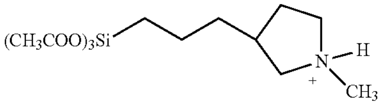

Formula (II-4)

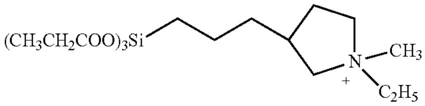

-continued

Formula (II-5)

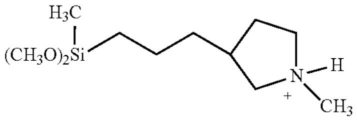

Formula (II-6)

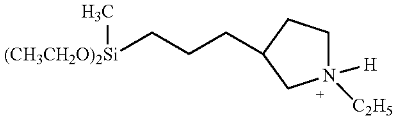

Formula (II-7)

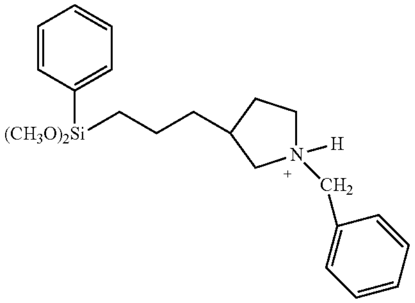

Formula (II-8)

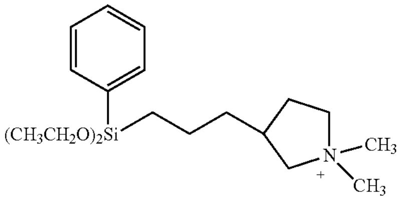

Formula (II-9)

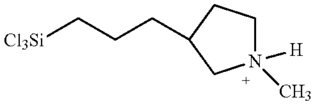

Formula (II-10)

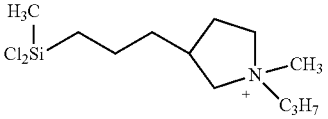

Formula (II-11)

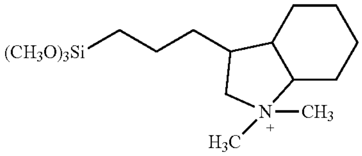

Formula (II-12)

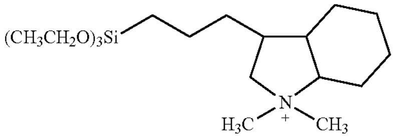

Formula (II-13)

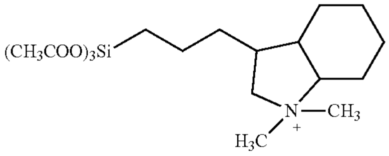

-continued

Formula (II-14)

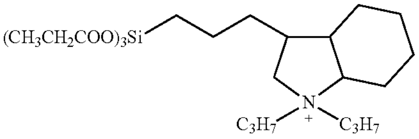

Formula (II-15)

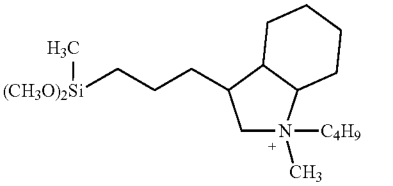

Formula (II-16)

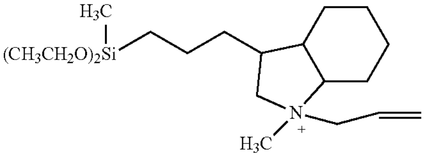

Formula (II-17)

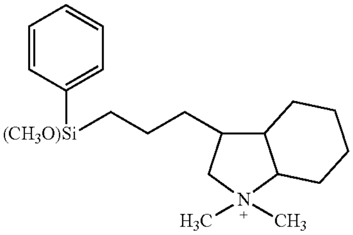

Formula (II-18)

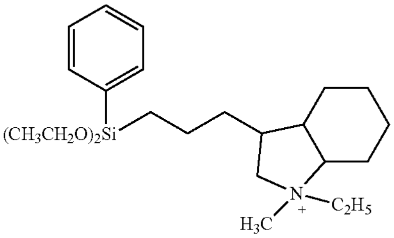

Formula (II-19)

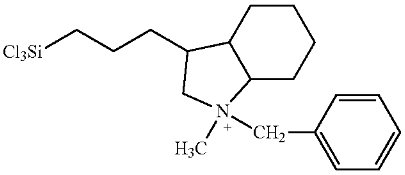

Formula (II-20)

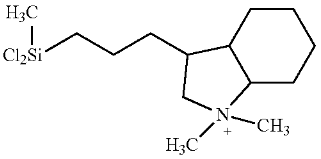

Formula (II-21)

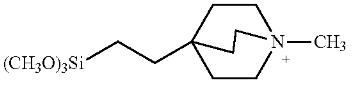

Formula (II-22)

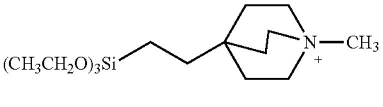

-continued

Formula (II-23)

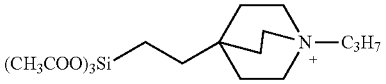

Formula (II-24)

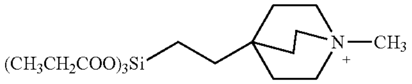

Formula (II-25)

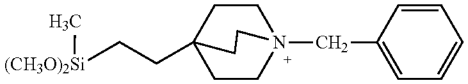

Formula (II-26)

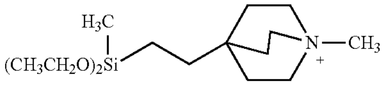

Formula (II-27)

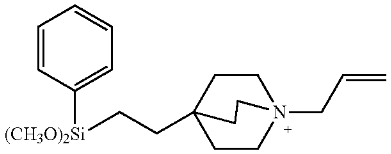

Formula (II-28)

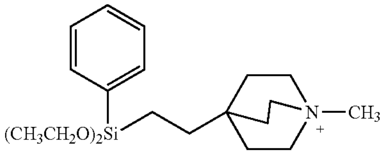

Formula (II-29)

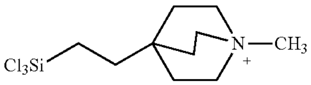

Formula (II-30)

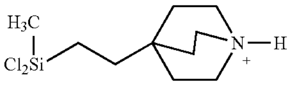

In another preferred embodiment of the present invention, $R^{31}$ is a chain ammonium group of the following Formula (S3).

(S3)

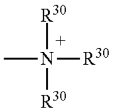

$R^{30}$ is each independently a hydrogen atom, an alkyl group, an aryl group, an aralkyl group, a halogenated alkyl group, a halogenated aryl group, a halogenated aralkyl group, or an alkenyl group. Specific examples of the alkyl group, the aryl group, the aralkyl group, the halogenated alkyl group, the halogenated aryl group, the halogenated aralkyl group, and the alkenyl group, and preferred carbon atom numbers thereof are the same as those described above.

The chain ammonium group of Formula (S3) is directly bonded to the silicon atom. Alternatively, the chain ammonium group is bonded to a linking group to form an organic group containing the chain ammonium group, and the organic group is bonded to the silicon atom.

The linking group is, for example, an alkylene group, an arylene group, or an alkenylene group. Specific examples of the alkylene group, the arylene group, and the alkenylene group are the same as those described above.

Specific examples of the hydrolyzable organosilane of Formula (4) having the chain ammonium group of Formula (S3) include, but are not limited to, those described below.

Formula (III-1)

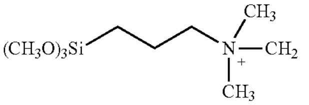

Formula (III-2)

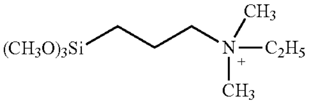

Formula (III-3)

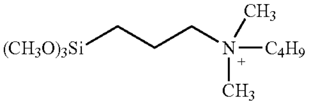

Formula (III-4)

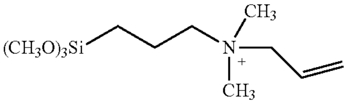

Formula (III-5)

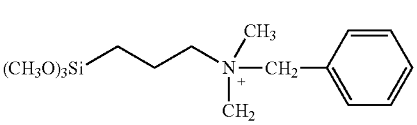

Formula (III-6)

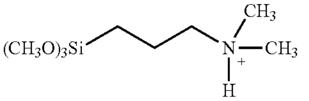

Formula (III-7)

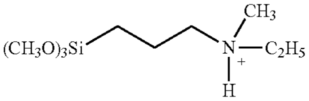

Formula (III-8)

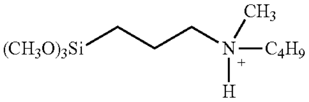

Formula (III-9)

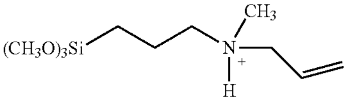

Formula (III-10)

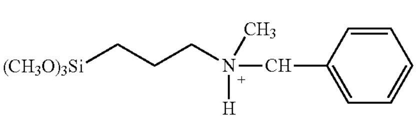

Formula (III-11)

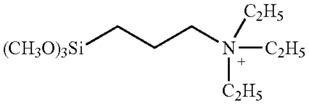

Formula (III-12)

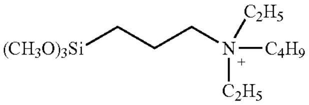

-continued

Formula (III-13)

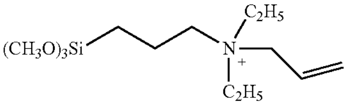

Formula (III-14)

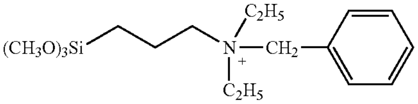

Formula (III-15)

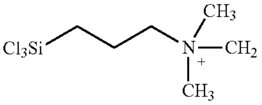

Formula (III-16)

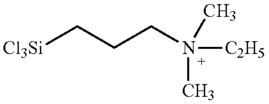

Formula (III-17)

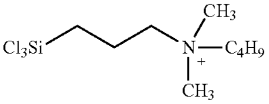

Formula (III-18)

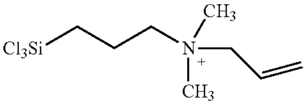

Formula (III-19)

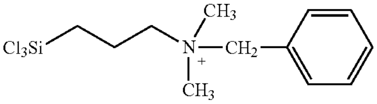

Formula (III-20)

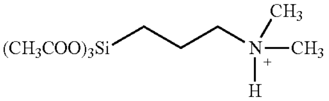

Formula (III-21)

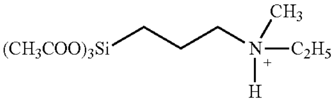

Formula (III-22)

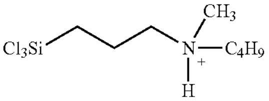

Formula (III-23)

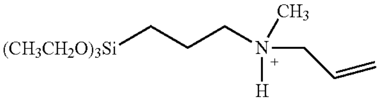

Formula (III-24)

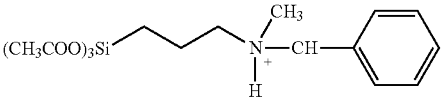

Formula (III-25)

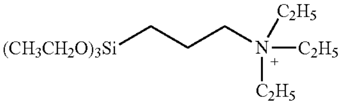

-continued

Formula (III-26)

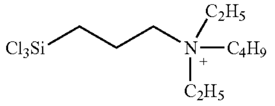

Formula (III-27)

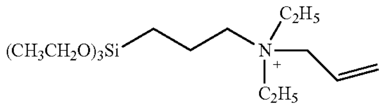

Formula (III-28)

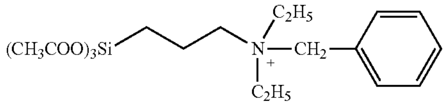

The film-forming composition of the present invention may further contain, as a hydrolyzable silane, a silane having a sulfone group or a silane having a sulfonamide group.

Specific examples of such a silane include, but are not limited to, those described below.

Formula (B-1)

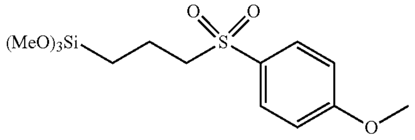

Formula (B-2)

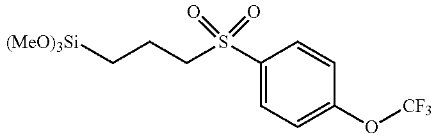

Formula (B-3)

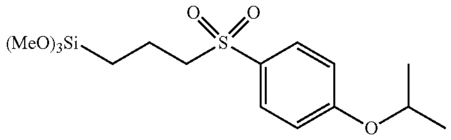

Formula (B-4)

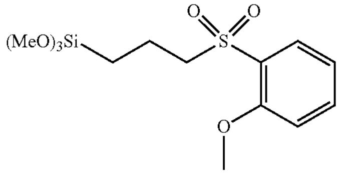

Formula (B-5)

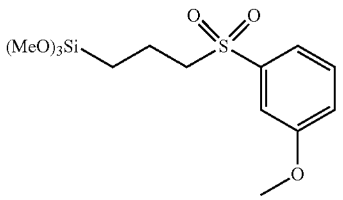

-continued

Formula (B-6)

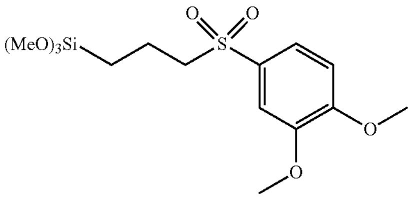

Formula (B-7)

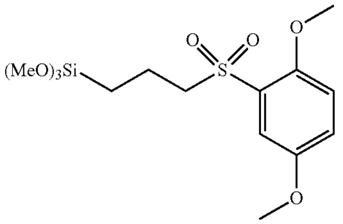

Formula (B-8)

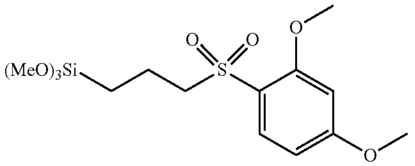

Formula (B-9)

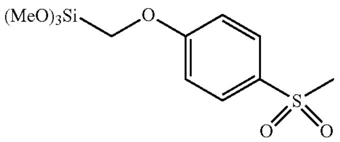

Formula (B-10)

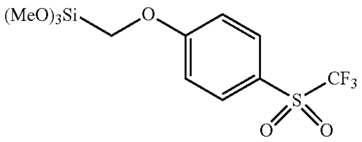

Formula (B-11)

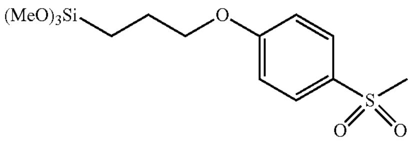

Formula (B-12)

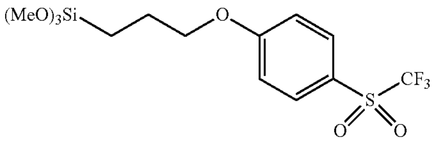

Formula (B-13)

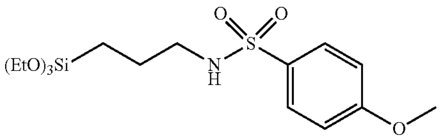

Formula (B-14)

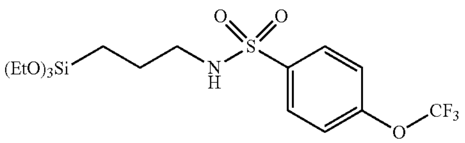

-continued
Formula (B-15)
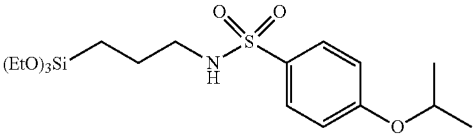
Formula (B-16)
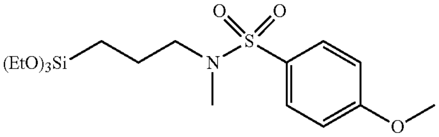
Formula (B-17)
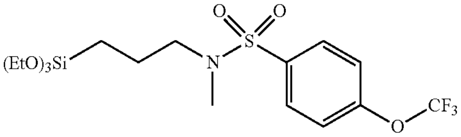
Formula (B-18)
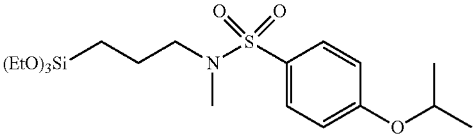
Formula (B-19)
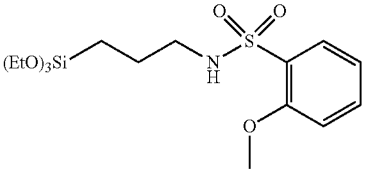
Formula (B-20)
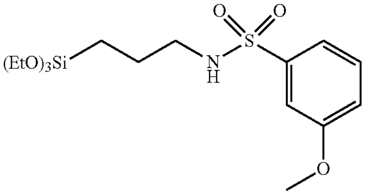
Formula (B-21)
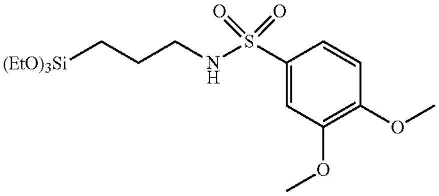
Formula (B-22)
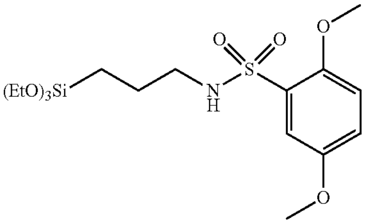
-continued
Formula (B-23)
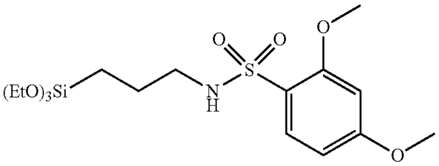
Formula (B-24)
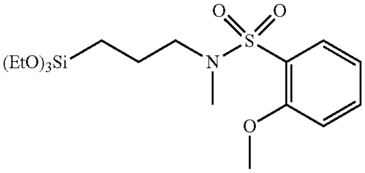
Formula (B-25)
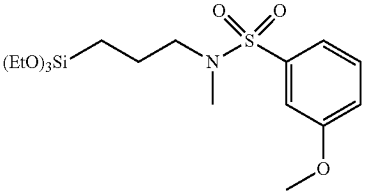
Formula (B-26)
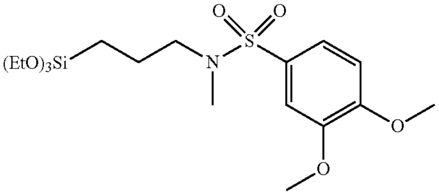
Formula (B-27)
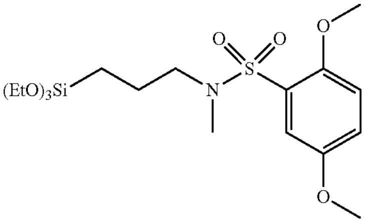
Formula (B-28)
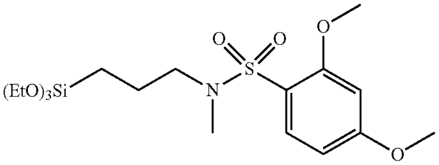
Formula (B-29)
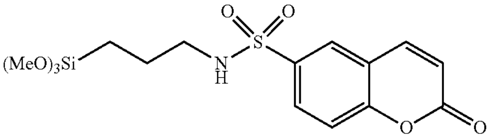
Formula (B-30)
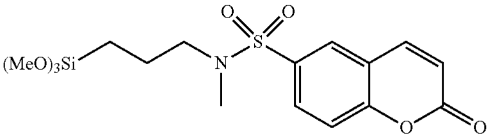

-continued

Formula (B-31)

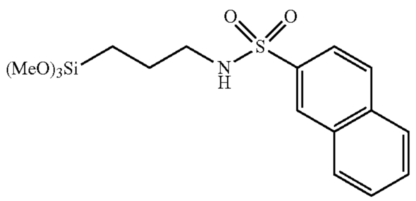

Formula (B-32)

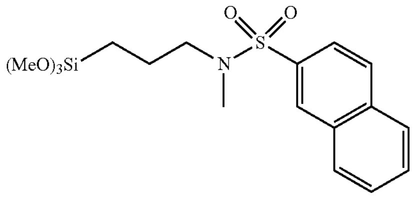

Formula (B-33)

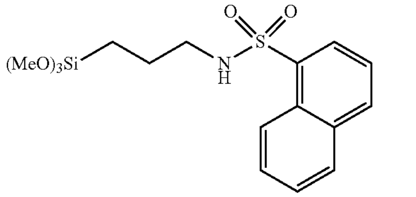

Formula (B-34)

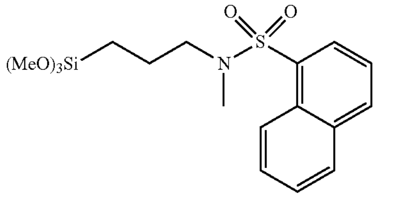

Formula (B-35)

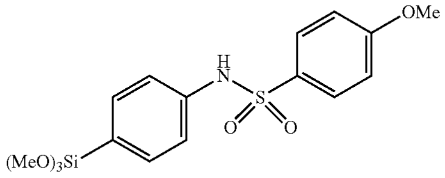

Formula (B-36)

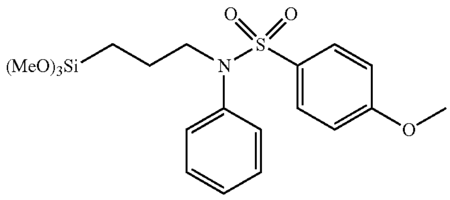

In the present invention, the aforementioned hydrolyzable silane compound may contain a hydrolyzable organosilane having a cyclic urea structure in the molecule. Specific examples of the hydrolyzable organosilane include, but are not limited to, a hydrolyzable organosilane of the following Formula (5-1).

$$R^{501}{}_xR^{502}{}_ySi(R^{503})_{4-(x+y)} \quad (5\text{-}1)$$

In Formula (5-1), $R^{501}$ is a group bonded to the silicon atom, and is each independently a group of the following Formula (5-2); $R^{502}$ is a group bonded to the silicon atom, and is a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, or a cyano group; $R^{503}$ is a group or atom bonded to the silicon atom, and is each independently an alkoxy group, an aralkyloxy group, an acyloxy group, or a halogen atom; x is 1 or 2; y is 0 or 1; and x and y satisfy a relation of $x+y \leq 2$. Specific examples of the alkyl group, aryl group, aralkyl group, halogenated alkyl group, halogenated aryl group, halogenated aralkyl group, alkoxyalkyl group, alkoxyaryl group, alkoxyaralkyl group, alkenyl group, and organic group containing an epoxy group, an acryloyl group, a methacryloyl group, a mercapto group, or a cyano group of $R^{502}$, the alkoxy group, aralkyloxy group, acyloxy group, and halogen atom of $R^{503}$, and the substituent of each of these groups, and preferred carbon atom numbers thereof are the same as those described above regarding $R^2$ and $R^3$.

(5-2)

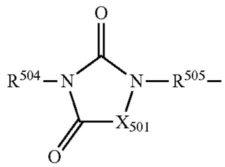

In Formula (5-2), $R^{504}$ is each independently a hydrogen atom, a substitutable alkyl group, a substitutable alkenyl group, or an organic group containing an epoxy group or a sulfonyl group; and $R^{505}$ is each independently an alkylene group, a hydroxyalkylene, a sulfide bond (—S—), an ether bond (—O—), or an ester bond (—CO—O— or —O—CO—).

Specific examples of the substitutable alkyl group, substitutable alkenyl group, and organic group containing an epoxy group of $R^{504}$, and preferred carbon atom numbers thereof are the same as those described above regarding $R^2$. Other preferred examples of the substitutable alkyl group of $R^{504}$ include an alkyl group wherein the terminal hydrogen atom is substituted with a vinyl group. Specific examples of the alkyl group include allyl group, 2-vinylethyl group, 3-vinylpropyl group, and 4-vinylbutyl group.

No particular limitation is imposed on the organic group containing a sulfonyl group, so long as it contains a sulfonyl group. Examples of the organic group containing a sulfonyl group include substitutable alkylsulfonyl group, substitutable arylsulfonyl group, substitutable aralkylsulfonyl group, substitutable halogenated alkylsulfonyl group, substitutable halogenated arylsulfonyl group, substitutable halogenated aralkylsulfonyl group, substitutable alkoxyalkylsulfonyl group, substitutable alkoxyarylsulfonyl group, substitutable alkoxyaralkylsulfonyl group, and substitutable alkenylsulfonyl group. Specific examples of the alkyl group, aryl group, aralkyl group, halogenated alkyl group, halogenated aryl group, halogenated aralkyl group, alkoxyalkyl group, alkoxyaryl group, alkoxyaralkyl group, and alkenyl group of the aforementioned groups, the substituent of these groups, and preferred carbon atom numbers thereof are the same as those described above regarding $R^2$.

The alkylene group is a divalent group derived from the aforementioned alkyl group through removal of one hydrogen atom, and may have a linear, branched, or cyclic structure. Specific examples of the alkylene group are the same as those described above. No particular limitation is imposed on the carbon atom number of the alkylene group, but the carbon atom number is preferably 40 or less, more preferably 30 or less, still more preferably 20 or less, much more preferably 10 or less.

The alkylene group of $R^{505}$ may have one or two or more selected from among a sulfide bond, an ether bond, and an ester bond at an end or middle portion (preferably at a middle portion) of the alkylene group.

Specific examples of the alkylene group include, but are not limited to, linear alkylene groups, such as methylene group, ethylene group, trimethylene group, methylethylene group, tetramethylene group, pentamethylene group, hexamethylene group, heptamethylene group, octamethylene group, nonamethylene group, and decamethylene group; branched alkylene groups, such as 1-methyltrimethylene group, 2-methyltrimethylene group, 1,1-dimethylethylene group, 1-methyltetramethylene group, 2-methyltetramethylene group, 1,1-dimethyltrimethylene group, 1,2-dimethyltrimethylene group, 2,2-dimethyltrimethylene group, and 1-ethyltrimethylene group; cyclic alkylene groups, such as 1,2-cyclopropanediyl group, 1,2-cyclobutanediyl group, 1,3-cyclobutanediyl group, 1,2-cyclohexanediyl group, and 1,3-cyclohexanediyl group; and alkylene groups containing an ether group, etc. such as $-CH_2OCH_2-$, $-CH_2CH_2OCH_2-$, $-CH_2CH_2OCH_2CH_2-$, $-CH_2CH_2CH_2OCH_2CH_2-$, $-CH_2CH_2OCH_2CH_2CH_2-$, $-CH_2CH_2CH_2OCH_2CH_2CH_2-$, $-CH_2SCH_2-$, $-CH_2CH_2SCH_2-$, $-CH_2CH_2SCH_2CH_2-$, $-CH_2CH_2CH_2SCH_2CH_2-$, $-CH_2CH_2SCH_2CH_2CH_2-$, $-CH_2CH_2CH_2SCH_2CH_2CH_2-$, and $-CH_2OCH_2CH_2SCH_2-$.

The hydroxyalkylene group acid is prepared by substitution of at least one hydrogen atom of the aforementioned alkylene group with a hydroxy group. Specific examples of the hydroxyalkylene group include, but are not limited to, hydroxymethylene group, 1-hydroxyethylene group, 2-hydroxyethylene group, 1,2-dihydroxyethylene group, 1-hydroxytrimethylene group, 2-hydroxytrimethylene group, 3-hydroxytrimethylene group, 1-hydroxytetramethylene group, 2-hydroxytetramethylene group, 3-hydroxytetramethylene group, 4-hydroxytetramethylene group, 1,2-dihydroxytetramethylene group, 1,3-dihydroxytetramethylene group, 1,4-dihydroxytetramethylene group, 2,3-dihydroxytetramethylene group, 2,4-dihydroxytetramethylene group, and 4,4-dihydroxytetramethylene group.

In Formula (5-2), $X_{501}$ is each independently a group of any of the following Formulae (5-3) to (5-5), and the carbon atom of the ketone group in each of the following Formulae (5-4) and (5-5) is bonded to the nitrogen atom bonded to $R^{505}$ in Formula (5-2).

(5-3)

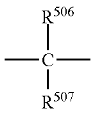

(5-4)

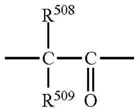

-continued (5-5)

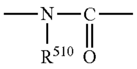

In Formulae (5-3) to (5-5), $R^{506}$ to $R^{510}$ are each independently a hydrogen atom, a substitutable alkyl group, a substitutable alkenyl group, or an organic group containing an epoxy group or a sulfonyl group. Specific examples of the substitutable alkyl group, substitutable alkenyl group, and organic group containing an epoxy group or a sulfonyl group, and preferred carbon atom numbers thereof are the same as those described above regarding $R^{504}$.

In particular, $X_{501}$ is preferably a group of Formula (5-5), from the viewpoint of achieving excellent lithographic property at high reproducibility.

At least one of $R^{504}$ and $R^{506}$ to $R^{510}$ is preferably an alkyl group wherein the terminal hydrogen atom is substituted with a vinyl group, from the viewpoint of achieving excellent lithographic property at high reproducibility.

The hydrolyzable organosilane of Formula (5-1) may be a commercially available product, or may be synthesized by a known method described in, for example, WO 2011/102470.

Specific examples of the hydrolyzable organosilane of Formula (5-1) include, but are not limited to, those described below.

Formula (5-1-1)

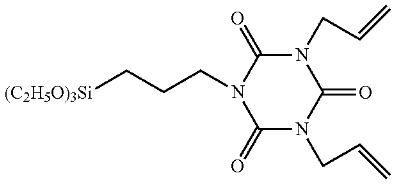

Formula (5-1-2)

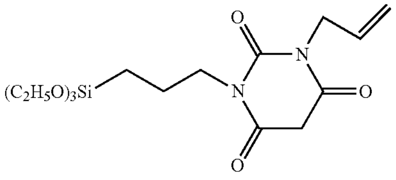

Formula (5-1-3)

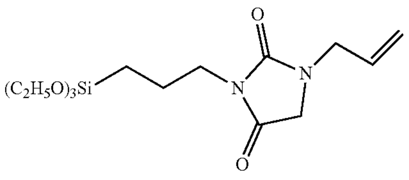

Formula (5-1-4)

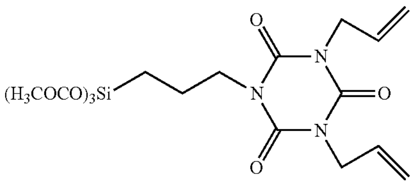

-continued
Formula (5-1-5)
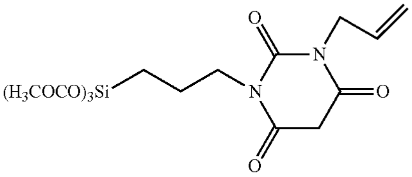
Formula (5-1-6)
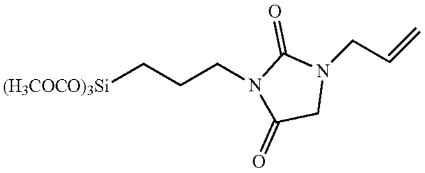
Formula (5-1-7)
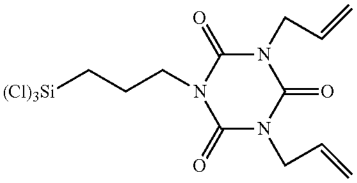
Formula (5-1-8)
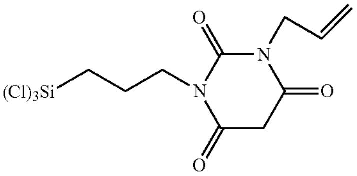
Formula (5-1-9)
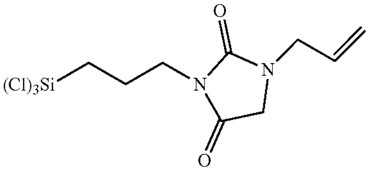
Formula (5-1-10)
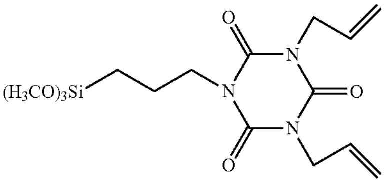
Formula (5-1-11)
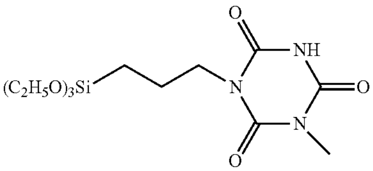
Formula (5-1-12)
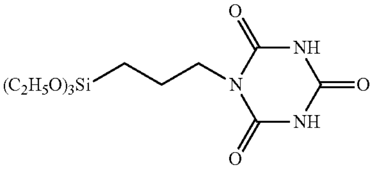
-continued
Formula (5-1-13)
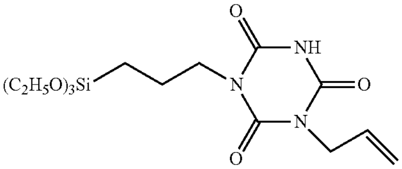
Formula (5-1-14)
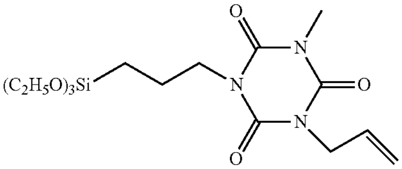
Formula (5-1-15)
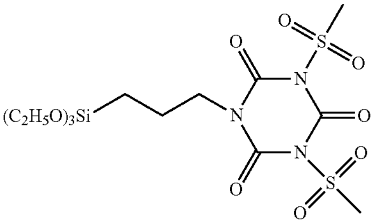
Formula (5-1-16)
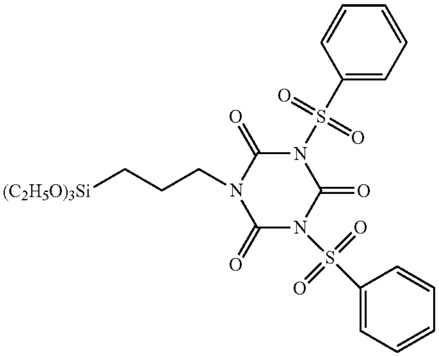
Formula (5-1-17)
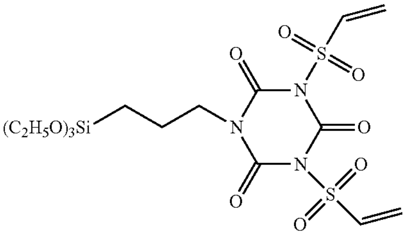
Formula (5-1-18)
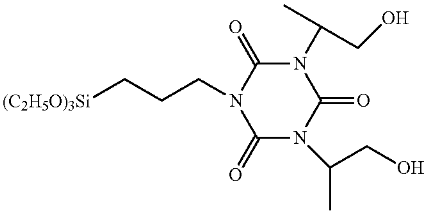

-continued

Formula (5-1-19)

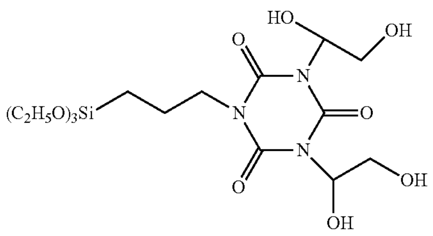

Formula (5-1-20)

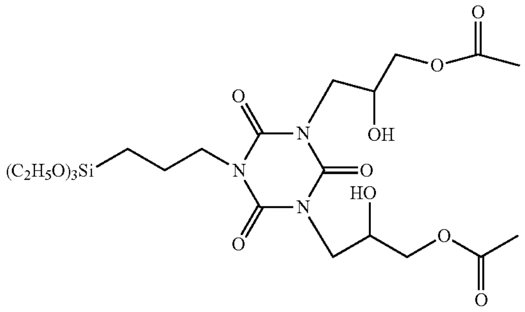

Formula (5-1-21)

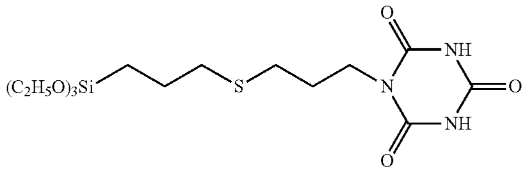

Formula (5-1-22)

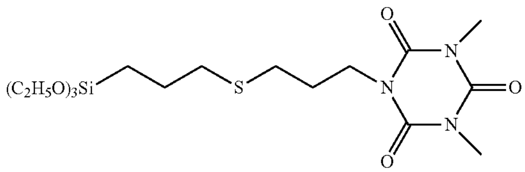

Formula (5-1-23)

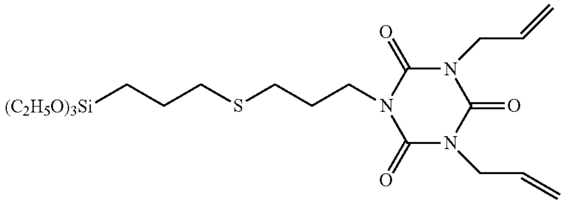

Formula (5-1-24)

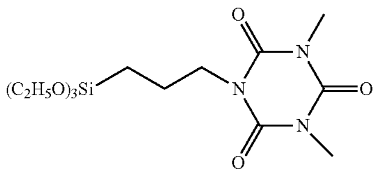

Formula (5-1-25)

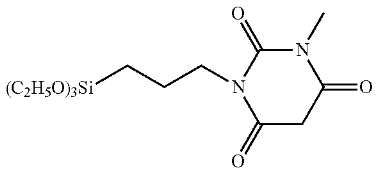

-continued

Formula (5-1-26)

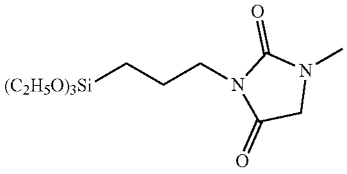

Formula (5-1-27)

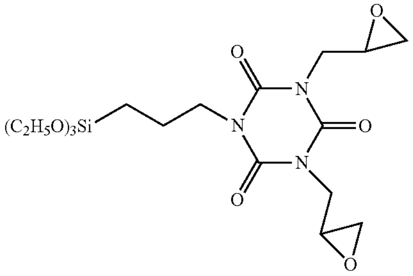

Formula (5-1-28)

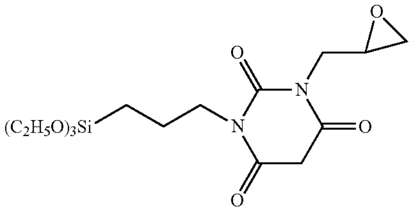

Formula (5-1-29)

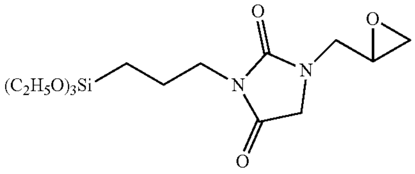

In one preferred embodiment of the present invention, the hydrolysis condensate contained in the film-forming composition of the present invention contains a hydrolysis condensate prepared from at least the amino-group-containing silane of Formula (1) and the additional silane of Formula (2). In another preferred embodiment of the present invention, the hydrolysis condensate contained in the film-forming composition of the present invention contains a hydrolysis condensate prepared from at least the amino-group-containing silane of Formula (1), the additional silane of Formula (2), and the hydrolyzable organosilane of Formula (5-1).

In the present invention, the hydrolysis condensate generally has a weight average molecular weight of 500 to 1,000,000. From the viewpoint of, for example, preventing the precipitation of the hydrolysis condensate in the composition, the weight average molecular weight is preferably 500,000 or less, more preferably 250,000 or less, still more preferably 100,000 or less. From the viewpoint of, for example, the compatibility between storage stability and applicability, the weight average molecular weight is preferably 700 or more, more preferably 1,000 or more.

The weight average molecular weight is determined by GPC analysis in terms of polystyrene. The GPC analysis can be performed under, for example, the following conditions: GPC apparatus (trade name: HLC-8220GPC, available from Tosoh Corporation), GPC columns (trade name: Shodex KF803L, KF802, and KF801, available from Showa Denko K.K.), a column temperature of 40° C., tetrahydrofuran serving as an eluent (elution solvent), a flow amount (flow rate) of 1.0 mL/min, and polystyrene (available from Showa Denko K.K.) as a standard sample.

The film-forming composition of the present invention may contain an organic acid, water, an alcohol, etc. for the purpose of, for example, stabilization of the hydrolysis condensate.

Specific examples of the organic acid that may be contained in the film-forming composition of the present invention for the aforementioned purpose include, but are not limited to, oxalic acid, malonic acid, methylmalonic acid, succinic acid, maleic acid, malic acid, tartaric acid, phthalic acid, citric acid, glutaric acid, lactic acid, and salicylic acid. Of these, oxalic acid or maleic acid is preferred.

When the film-forming composition of the present invention contains an organic acid, the amount of the organic acid is 0.1% by mass to 5.0% by mass relative to the total mass of the hydrolyzable silane, a hydrolysate of the silane, and a hydrolysis condensate of the silane.

The alcohol that may be contained in the film-forming composition of the present invention for the aforementioned purpose is preferably an alcohol that easily evaporates by heating after the application of the composition. Specific examples of the alcohol include lower aliphatic alcohols, such as methanol, ethanol, propanol, isopropanol, and butanol.

When the film-forming composition of the present invention contains an alcohol, the amount of the alcohol is 1 part by mass to 20 parts by mass relative to 100 parts by mass of the composition.

If necessary, the film-forming composition of the present invention may further contain an organic polymer compound, an acid generator, a surfactant, etc.

The organic polymer compound that may be contained in the film-forming composition of the present invention is appropriately selected from among various organic polymers (polycondensation polymer and addition polymerization polymer) depending on the purpose of addition thereof.

Specific examples of the organic polymer compound include addition polymerization polymers and polycondensation polymers, such as polyester, polystyrene, polyimide, acrylic polymer, methacrylic polymer, polyvinyl ether, phenol novolac, naphthol novolac, polyether, polyamide, and polycarbonate.

In the present invention, an organic polymer having an aromatic or heteroaromatic ring that functions as a light-absorbing moiety (e.g., a benzene ring, a naphthalene ring, an anthracene ring, a triazine ring, a quinoline ring, or a quinoxaline ring) can also be suitably used in the case where such a function is required. Specific examples of such an organic polymer compound include, but are not limited to, addition polymerization polymers containing, as structural units, addition polymerizable monomers (e.g., benzyl acrylate, benzyl methacrylate, phenyl acrylate, naphthyl acrylate, anthryl methacrylate, anthrylmethyl methacrylate, styrene, hydroxystyrene, benzyl vinyl ether, and N-phenylmaleimide); and polycondensation polymers such as phenol novolac and naphthol novolac.

When an addition polymerization polymer is used as an organic polymer compound, the polymer compound may be a homopolymer or a copolymer.

An addition polymerizable monomer is used for the production of the addition polymerization polymer. Specific examples of the addition polymerizable monomer include, but are not limited to, acrylic acid, methacrylic acid, an acrylate ester compound, a methacrylate ester compound, an acrylamide compound, a methacrylamide compound, a vinyl compound, a styrene compound, a maleimide compound, maleic anhydride, and acrylonitrile.

Specific examples of the acrylate ester compound include, but are not limited to, methyl acrylate, ethyl acrylate, normal hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Specific examples of the methacrylate ester compound include, but are not limited to, methyl methacrylate, ethyl methacrylate, normal hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Specific examples of the acrylamide compound include, but are not limited to, acrylamide, N-methylacrylamide, N-ethylacrylamide, N-benzylacrylamide, N-phenylacrylamide, N,N-dimethylacrylamide, and N-anthrylacrylamide.

Specific examples of the methacrylamide compound include, but are not limited to, methacrylamide, N-methylmethacrylamide, N-ethylmethacrylamide, N-benzylmethacrylamide, N-phenylmethacrylamide, N,N-dimethylmethacrylamide, and N-anthrylmethacrylamide.

Specific examples of the vinyl compound include, but are not limited to, vinyl alcohol, 2-hydroxyethyl vinyl ether, methyl vinyl ether, ethyl vinyl ether, benzyl vinyl ether, vinyl acetate, vinyltrimethoxysilane, 2-chloroethyl vinyl ether, 2-methoxyethyl vinyl ether, vinylnaphthalene, and vinylanthracene.

Specific examples of the styrene compound include, but are not limited to, styrene, hydroxystyrene, chlorostyrene, bromostyrene, methoxystyrene, cyanostyrene, and acetylstyrene.

Examples of the maleimide compound include, but are not limited to, maleimide, N-methylmaleimide, N-phenylmaleimide, N-cyclohexylmaleimide, N-benzylmaleimide, and N-hydroxyethylmaleimide.

When a polycondensation polymer is used as the polymer, the polymer is, for example, a polycondensation polymer composed of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride. Examples of the polymer include, but are not limited to, polyesters, polyamides, and polyimides, such as polypyromellitimide, poly(p-phenyleneterephthalamide), polybutylene terephthalate, and polyethylene terephthalate.

When the organic polymer compound contains a hydroxy group, the hydroxy group can be crosslinked with, for example, a hydrolysis condensate.

The organic polymer compound that may be contained in the film-forming composition of the present invention generally has a weight average molecular weight of 1,000 to 1,000,000. From the viewpoint of, for example, preventing the precipitation of the polymer in the composition, the weight average molecular weight is preferably 300,000 or less, more preferably 200,000 or less, still more preferably 100,000. From the viewpoint of, for example, sufficiently achieving the functional effect of the polymer, the weight average molecular weight is preferably 3,000 or more, more preferably 5,000 or more, still more preferably 10,000 or more.

These organic polymer compounds may be used alone or in combination of two or more species.

When the film-forming composition of the present invention contains an organic polymer compound, the amount of the organic polymer compound cannot be univocally determined, since the amount should be appropriately determined in consideration of, for example, the function of the organic polymer compound. The amount of the organic polymer compound is generally 1% by mass to 200% by mass relative to the mass of a hydrolysis condensate of the hydrolyzable silane. From the viewpoint of, for example, preventing the precipitation of the polymer compound in the composition, the amount is preferably 100% by mass or less, more preferably 50% by mass or less, still more preferably 30% by mass or less. From the viewpoint of, for example, sufficiently achieving the effect of the polymer compound, the amount is preferably 5% by mass or more, more preferably 10% by mass or more, still more preferably 30% by mass or more.

When the film-forming composition of the present invention contains an acid generator, the acid generator is, for example, a thermal acid generator or a photoacid generator.

Examples of the photoacid generator include, but are not limited to, an onium salt compound, a sulfonimide compound, and a disulfonyldiazomethane compound.

Specific examples of the onium salt compound include, but are not limited to, iodonium salt compounds, such as diphenyliodonium hexafluorophosphate, diphenyliodonium trifluoromethanesulfonate, diphenyliodonium nonafluoro normal butanesulfonate, diphenyliodonium perfluoro normal octanesulfonate, diphenyliodonium camphorsulfonate, bis(4-t-butylphenyl)iodonium camphorsulfonate, and bis(4-t-butylphenyl)iodonium trifluoromethanesulfonate; and sulfonium salt compounds, such as triphenylsulfonium hexafluoroantimonate, triphenylsulfonium nonafluoro normal butanesulfonate, triphenylsulfonium camphorsulfonate, and triphenylsulfonium trifluoromethanesulfonate.

Specific examples of the sulfonimide compound include, but are not limited to, N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy)naphthalimide.

Specific examples of the disulfonyldiazomethane compound include, but are not limited to, bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

These acid generators may be used alone or in combination of two or more species.

When the film-forming composition of the present invention contains an acid generator, the amount of the acid generator cannot be univocally determined, since the amount should be appropriately determined in consideration of, for example, the type of the acid generator. The amount of the acid generator is generally 0.01% by mass to 5% by mass relative to the mass of a hydrolysis condensate of the hydrolyzable silane. From the viewpoint of, for example, preventing the precipitation of the acid generator in the composition, the amount is preferably 3% by mass or less, more preferably 1% by mass or less. From the viewpoint of, for example, sufficiently achieving the effect of the acid generator, the amount is preferably 0.1% by mass or more, more preferably 0.5% by mass or more.

When the film-forming composition of the present invention is used as a resist underlayer film-forming composition for lithography, a surfactant particularly effectively prevents formation of, for example, pinholes and striations during application of the composition to a substrate.

Specific examples of such a surfactant include, but are not limited to, nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylaryl ethers, such as polyoxyethylene octylphenol ether and polyoxyethylene nonylphenol ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants, such as trade names EFTOP EF301, EF303, and EF352 (available from Tohkem Products Corporation), trade names MEGAFAC F171, F173, R-08, R-30, R-30N, and R-40 LM (available from DIC Corporation), Fluorad FC430 and FC431 (available from Sumitomo 3M Limited), trade name Asahi Guard AG710 and trade names SURFLON S-382, SC101, SC102, SC103, SC104, SC105, and SC106 (available from AGC Inc.); and Organosiloxane Polymer KP341 (available from Shin-Etsu Chemical Co., Ltd.).

These surfactants may be used alone or in combination of two or more species.

When the film-forming composition of the present invention contains a surfactant, the amount of the surfactant is generally 0.0001 parts by mass to 5 parts by mass relative to 100 parts by mass of the hydrolysis condensate (polyorganosiloxane). From the viewpoint of, for example, preventing the precipitation of the surfactant in the composition, the amount is preferably 1 part by mass or less. From the viewpoint of, for example, sufficiently achieving the effect of the surfactant, the amount is preferably 0.001 parts by mass or more, more preferably 0.01 parts by mass or more.

Preferably, the film-forming composition of the present invention does not contain a curing catalyst as an additive. When a curing catalyst is incorporated as an additive, the additive may partially migrate into a resist film during formation of the resist film or subsequent heating, resulting in deteriorated properties. In order to avoid such a problem, a curing catalyst is not incorporated in the composition.

The film-forming composition of the present invention may further contain a rheology controlling agent, an adhesion aid, a pH adjuster, etc. The rheology controlling agent effectively improves the fluidity of the film-forming composition. The adhesion aid effectively improves the adhesion between a resist underlayer film formed from the film-forming composition of the present invention and a semiconductor substrate, an organic underlayer film, or a resist film.

The pH adjuster that may be added in the composition is bisphenol S or a bisphenol S derivative. The amount of bisphenol S or a bisphenol S derivative is 0.01 parts by mass to 20 parts by mass, or 0.01 parts by mass to 10 parts by mass, or 0.01 parts by mass to 5 parts by mass, relative to 100 parts by mass of the hydrolysis condensate (polyorganosiloxane).

Specific examples of the bisphenol S or the bisphenol S derivative include, but are not limited to, those described below.

Formula (C-1)

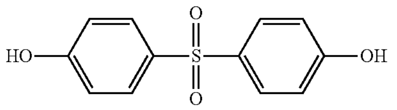

Formula (C-2)

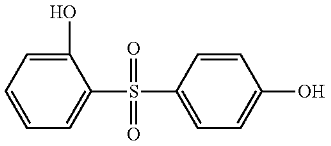

Formula (C-3)

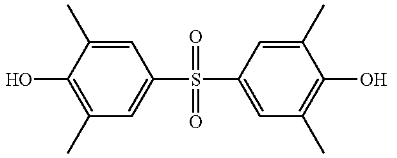

Formula (C-4)

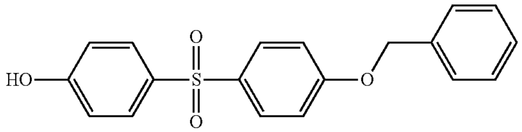

Formula (C-5)

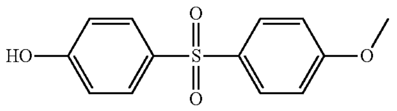

Formula (C-6)

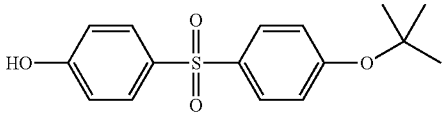

Formula (C-7)

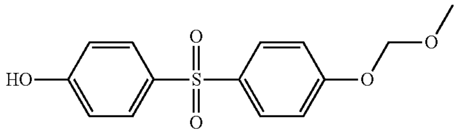

Formula (C-8)

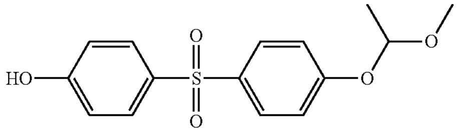

Formula (C-9)

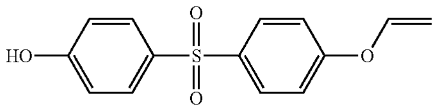

-continued

Formula (C-10)

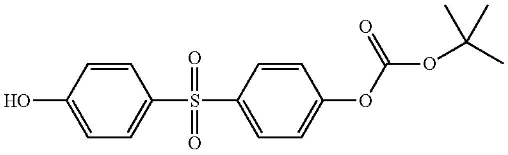

Formula (C-11)

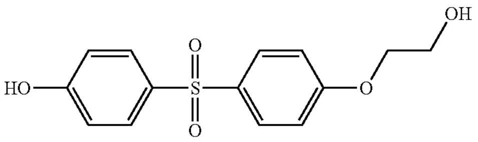

Formula (C-12)

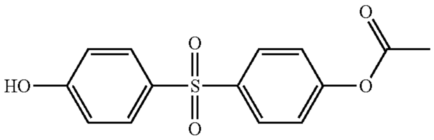

Formula (C-13)

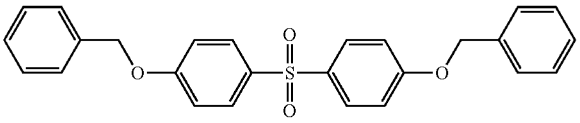

Formula (C-14)

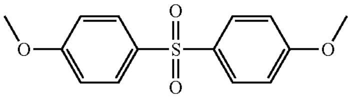

Formula (C-15)

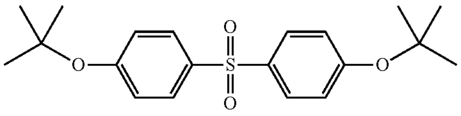

Formula (C-16)

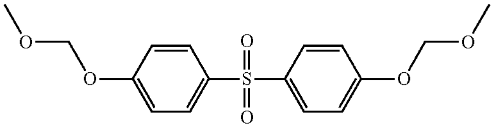

Formula (C-17)

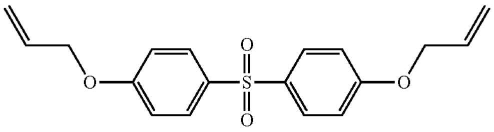

Formula (C-18)

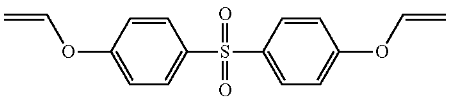

Formula (C-19)

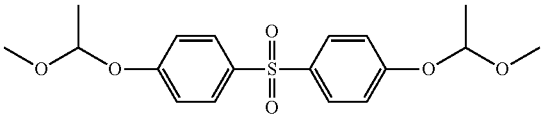

-continued

Formula (C-20)

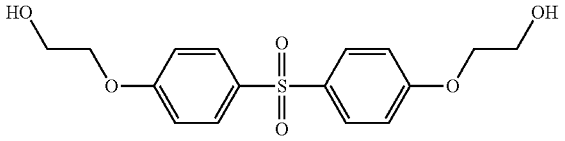

Formula (C-21)

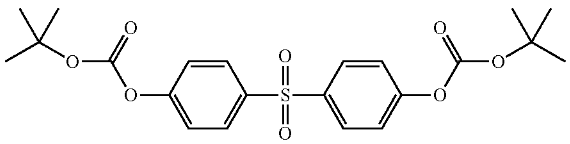

Formula (C-22)

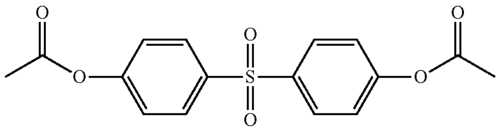

Formula (C-23)

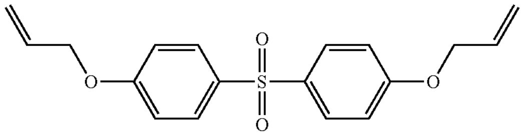

The hydrolysis condensate used in the present invention can be prepared by hydrolysis and condensation of the aforementioned hydrolyzable silane compound. As described above, the hydrolysis may be complete hydrolysis or partial hydrolysis. As described above, the hydrolysis condensate contained in the film-forming composition of the present invention may contain a complete hydrolysate and a partial hydrolysate. The composition may contain a remaining hydrolyzable silane (i.e., monomer).

In the present invention, as described above, an acidic compound containing two or more acidic groups is used for hydrolysis and condensation of the aforementioned hydrolyzable silane compound. From the viewpoint of achieving the effects of the present invention at high reproducibility, the amount of the acidic compound containing two or more acidic groups used is determined such that the amount of the two or more acidic groups of the acidic compound is generally 0.001 mol to 10 mol, preferably 0.002 mol to 5 mol, more preferably 0.003 mol to 3 mol, still more preferably 0.005 mol to 2 mol, much more preferably 0.007 mol to 1 mol, relative to 1 mol of the hydrolyzable group of the hydrolyzable silane compound.

The hydrolyzable silane compound used in the present invention contains an alkoxy group, aralkyloxy group, acyloxy group, or halogen atom directly bonded to the silicon atom; specifically, a hydrolyzable group (i.e., an alkoxysilyl group, an aralkyloxysilyl group, an acyloxysilyl group, or a halogenated silyl group). For the hydrolysis of the hydrolyzable group, generally 0.5 to 100 mol (preferably 1 mol to 10 mol) of water is used per mol of the hydrolyzable group.

During hydrolysis and condensation, a hydrolysis catalyst may be used for the purpose of, for example, promoting the hydrolysis and condensation.

Specific examples of the hydrolysis catalyst include, but are not limited to, a metal chelate compound, an organic base, and an inorganic base.

A single hydrolysis catalyst may be used, or two or more hydrolysis catalysts may be used in combination. The amount of the hydrolysis catalyst used is generally 0.001 mol to 10 mol, preferably 0.001 mol to 1 mol, relative to 1 mol of the hydrolyzable group.

Specific examples of the metal chelate compound include, but are not limited to, titanium chelate compounds, such as triethoxy-mono(acetylacetonato)titanium, tri-n-propoxy-mono(acetylacetonato)titanium, tri-isopropoxy-mono (acetylacetonato)titanium, tri-n-butoxy-mono(acetylacetonato)titanium, tri-s-butoxy-mono(acetylacetonato)titanium, tri-t-butoxy-mono(acetylacetonato)titanium, diethoxy-bis (acetylacetonato)titanium, di-n-propoxy-bis(acetylacetonato)titanium, di-isopropoxy-bis(acetylacetonato)titanium, di-n-butoxy-bis(acetylacetonato)titanium, di-s-butoxy-bis (acetylacetonato)titanium, di-t-butoxy-bis(acetylacetonato) titanium, monoethoxy-tris(acetylacetonato)titanium, mono-n-propoxy-tris(acetylacetonato)titanium, mono-isopropoxy-tris(acetylacetonato)titanium, mono-n-butoxy-tris (acetylacetonato)titanium, mono-s-butoxy-tris (acetylacetonato)titanium, mono-t-butoxy-tris (acetylacetonato)titanium, tetrakis(acetylacetonato) titanium, triethoxy-mono(ethylacetoacetato)titanium, tri-n-propoxy-mono(ethylacetoacetato)titanium, tri-isopropoxy-mono(ethylacetoacetato)titanium, tri-n-butoxy-mono (ethylacetoacetato)titanium, tri-s-butoxy-mono (ethylacetoacetato)titanium, tri-t-butoxy-mono (ethylacetoacetato)titanium, diethoxy-bis(ethylacetoacetato) titanium, di-n-propoxy-bis(ethylacetoacetato)titanium, di-isopropoxy-bis(ethylacetoacetato)titanium, di-n-butoxy-bis(ethylacetoacetato)titanium, di-s-butoxy-bis(ethylacetoacetato)titanium, di-t-butoxy-bis(ethylacetoacetato)titanium, monoethoxy-tris(ethylacetoacetato)titanium, mono-n-propoxy-tris(ethylacetoacetato)titanium, mono-isopropoxy-tris(ethylacetoacetato)titanium, mono-n-butoxy-tris (ethylacetoacetato)titanium, mono-s-butoxy-tris (ethylacetoacetato)titanium, mono-t-butoxy-tris (ethylacetoacetato)titanium, tetrakis(ethylacetoacetato) titanium, mono(acetylacetonato)tris(ethylacetoacetato) titanium, bis(acetylacetonato)bis(ethylacetoacetato) titanium, and tris(acetylacetonato)mono(ethylacetoacetato) titanium; zirconium chelate compounds, such as triethoxy-mono(acetylacetonato)zirconium, tri-n-propoxy-mono (acetylacetonato)zirconium, tri-isopropoxy-mono (acetylacetonato)zirconium, tri-n-butoxy-mono (acetylacetonato)zirconium, tri-s-butoxy-mono (acetylacetonato)zirconium, tri-t-butoxy-mono (acetylacetonato)zirconium, diethoxy-bis(acetylacetonato) zirconium, di-n-propoxy-bis(acetylacetonato)zirconium, di-isopropoxy-bis(acetylacetonato)zirconium, di-n-butoxy-bis(acetylacetonato)zirconium, di-s-butoxy-bis(acetylacetonato)zirconium, di-t-butoxy-bis(acetylacetonato)zirconium, monoethoxy-tris(acetylacetonato)zirconium, mono-n-propoxy-tris(acetylacetonato)zirconium, mono-isopropoxy-tris(acetylacetonato)zirconium, mono-n-butoxy-tris(acetylacetonato)zirconium, mono-s-butoxy-tris(acetylacetonato) zirconium, mono-t-butoxy-tris(acetylacetonato)zirconium, tetrakis(acetylacetonato)zirconium, triethoxy-mono(ethylacetoacetato)zirconium, tri-n-propoxy-mono(ethylacetoacetato)zirconium, tri-isopropoxy-mono(ethylacetoacetato) zirconium, tri-n-butoxy-mono(ethylacetoacetato)zirconium, tri-s-butoxy-mono(ethylacetoacetato)zirconium, tri-t-butoxy-mono(ethylacetoacetato)zirconium, diethoxy-bis(ethylacetoacetato)zirconium, di-n-propoxy-bis(ethylacetoacetato)zirconium, di-isopropoxy-bis(ethylacetoacetato) zirconium, di-n-butoxy-bis(ethylacetoacetato)zirconium, di-s-butoxy-bis(ethylacetoacetato)zirconium, di-t-butoxy-bis(ethylacetoacetato)zirconium, monoethoxy-tris(ethylacetoacetato)zirconium, mono-n-propoxy-tris(ethylacetoacetato)zirconium, mono-isopropoxy-tris(ethylacetoacetato) zirconium, mono-n-butoxy-tris(ethylacetoacetato) zirconium, mono-s-butoxy-tris(ethylacetoacetato) zirconium, mono-t-butoxy-tris(ethylacetoacetato) zirconium, tetrakis(ethylacetoacetato)zirconium, mono (acetylacetonato)tris(ethylacetoacetato)zirconium, bis (acetylacetonato)bis(ethylacetoacetato)zirconium, and tris (acetylacetonato)mono(ethylacetoacetato)zirconium; and aluminum chelate compounds, such as tris(acetylacetonato) aluminum and tris(ethylacetoacetato)aluminum.

Specific examples of the organic base include, but are not limited to, pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, trimethylphenylammonium hydroxide, benzyltrimethylammonium hydroxide, and benzyltriethylammonium hydroxide.

Specific examples of the inorganic base include, but are not limited to, ammonia, sodium hydroxide, potassium hydroxide, barium hydroxide, and calcium hydroxide.

Among these, a metal chelate compound is preferred as a hydrolysis catalyst.

The hydrolysis and condensation may involve the use of an organic solvent. Specific examples of the organic solvent include, but are not limited to, aliphatic hydrocarbon solvents, such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents, such as benzene, toluene, xylene, ethylbenzene, trimethylbenzene, methylethylbenzene, n-propylbenzene, isopropylbenzene, diethylbenzene, isobutylbenzene, triethylbenzene, di-isopropylbenzene, and n-amylnaphthalene; monohydric alcohol solvents, such as methanol, ethanol, n-propanol, isopropanol, n-butanol, isobutanol, s-butanol, t-butanol, n-pentanol, isopentanol, 2-methylbutanol, s-pentanol, t-pentanol, 3-methoxybutanol, n-hexanol, 2-methylpentanol, s-hexanol, 2-ethylbutanol, s-heptanol, 3-heptanol, n-octanol, 2-ethylhexanol, s-octanol, n-nonyl alcohol, 2,6-dimethyl-4-heptanol, n-decanol, s-undecyl alcohol, trimethylnonyl alcohol, s-tetradecyl alcohol, s-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol solvents, such as ethylene glycol, propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, and glycerin; ketone solvents, such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone; ether solvents, such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents, such as diethyl carbonate, methyl acetate, ethyl acetate, γ-butyrolactone, γ-valerolactone, n-propyl acetate, isopropyl acetate, n-butyl acetate, isobutyl acetate, s-butyl acetate, n-pentyl acetate, s-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents, such as dimethyl sulfide, diethyl sulfide, thiophene, tetrahydrothiophene, dimethyl sulfoxide, sulfolane, and 1,3-propanesultone. These solvents may be used alone or in combination of two or more species.

Of these, preferred are ketone solvents, such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone, from the viewpoint of the storage stability of the resultant solution.

The reaction temperature for hydrolysis or condensation is generally 20° C. to 80° C.

When a silane other than the amino-group-containing silane of Formula (1) is used as a hydrolyzable silane, the amount of the amino-group-containing silane of Formula (1) added is generally 0.1% by mole or more relative to the amount of all hydrolyzable silanes. From the viewpoint of achieving the aforementioned effects of the present invention at high reproducibility, the amount of the amino-group-containing silane is preferably 0.5% by mole or more, more preferably 1% by mole or more, still more preferably 5% by mole or more.

When the additional silane of Formula (2) or Formula (3) is used as a hydrolyzable silane, the amount of the additional silane added is generally 0.1% by mole or more, preferably 1% by mole or more, more preferably 5% by mole or more, and is generally 99.9% by mole or less, preferably 99% by mole or less, more preferably 95% by mole or less, relative to the amount of all hydrolyzable silanes.

When the hydrolyzable organosilane of Formula (4) is used as a hydrolyzable silane, the amount of the hydrolyzable organosilane added is generally 0.01% by mole or more, preferably 0.1% by mole or more, and is generally 30% by mole or less, preferably 10% by mole or less, relative to the amount of all hydrolyzable silanes.

When the hydrolyzable organosilane of Formula (5-1) is used as a hydrolyzable silane, the amount of the hydrolyzable organosilane added is generally 0.1% by mole or more, preferably 0.3% by mole or more, and is generally 50% by mole or less, preferably 30% by mole or less, relative to the amount of all hydrolyzable silanes.

Under the conditions described above, the hydrolysis condensate can be produced by hydrolysis and condensation of the hydrolyzable silane compound.

After completion of the reaction, the reaction mixture is used as is, or diluted or concentrated. The resultant reaction mixture can be neutralized or treated with an ion-exchange resin, to thereby remove the acid catalyst used for the hydrolysis. Before or after such a treatment, alcohols (i.e., by-products), water, the catalyst, etc. can be removed from the reaction mixture through, for example, distillation under reduced pressure.

If necessary, the solvent can be entirely or partially evaporated from the solution containing the hydrolysis condensate after the aforementioned purification, to thereby yield the hydrolysis condensate in the form of a solid or a solution containing the hydrolysis condensate.

The film-forming composition of the present invention can be produced by mixing of a hydrolysis condensate of the compound of the aforementioned hydrolyzable silane compound, a solvent, and an additional component (if incorporated). In this case, a solution containing the hydrolysis condensate, etc. may be previously prepared, and the solution may be mixed with a solvent and an additional component.

No particular limitation is imposed on the order of mixing of these components. For example, a solvent may be added to and mixed with a solution containing the hydrolysis condensate, etc., and an additional component may be added to the resultant mixture. Alternatively, a solution containing the hydrolysis condensate, etc., a solvent, and an additional component may be mixed simultaneously.

If necessary, an additional solvent may be finally added, or some components that can be relatively easily dissolved in a solvent may be finally added without being incorporated into the mixture. However, from the viewpoint of preventing aggregation or separation of components to prepare a highly homogeneous composition with high reproducibility, the composition is preferably produced from a previously prepared solution containing the well-dissolved hydrolysis condensate, etc. It should be noted that the hydrolysis condensate, etc. may be aggregated or precipitated when mixed with a solvent or an additional component, depending on, for example, the type or amount of the solvent or the amount or nature of the component. It should also be noted that when a composition is prepared from a solution containing the hydrolysis condensate, etc., the concentration of the solution of the hydrolysis condensate, etc. or the amount of the solution used must be determined so as to achieve a desired amount of the hydrolysis condensate, etc. contained in the finally produced composition.

During preparation of the composition, the composition may be appropriately heated so long as the components are not decomposed or denatured.

In the present invention, the film-forming composition may be filtered with, for example, a submicrometer-order filter during production of the composition or after mixing of all the components.

The concentration of the solid content in the film-forming composition of the present invention is generally 0.1% by mass to 50% by mass relative to the mass of the composition. From the viewpoint of, for example, preventing the precipitation of the solid content, the concentration is preferably 30% by mass or less, more preferably 25% by mass or less.

The amount of the hydrolysis condensate contained in the hydrolyzable silane compound in the solid content is generally 50% by mass or more, preferably 60% by mass or more, more preferably 70% by mass or more, still more preferably 80% by mass or more, much more preferably 90% by mass or more, from the viewpoint of achieving the aforementioned effects of the present invention at high reproducibility.

The film-forming composition of the present invention can be suitably used as a resist underlayer film-forming composition for a lithographic process.

In one embodiment of the present invention, the resist underlayer film-forming composition (composed of the film-forming composition of the present invention) is applied onto a substrate used for the production of a semiconductor device (e.g., a silicon wafer substrate, a silicon/silicon dioxide-coated substrate, a silicon nitride substrate, a glass substrate, an ITO substrate, a polyimide substrate, or a substrate coated with a low dielectric constant material (low-k material)) by an appropriate application method with, for example, a spinner or a coater, followed by baking of the composition, to thereby form the resist underlayer film of the present invention.

Generally, the baking is performed under appropriately determined conditions; i.e., a baking temperature of 80° C. to 250° C. and a baking time of 0.3 minutes to 60 minutes. Preferably, the baking temperature is 150° C. to 250° C., and the baking time is 0.5 minutes to 2 minutes.

The resist underlayer film of the present invention may further contain a metal oxide.

Examples of such a metal oxide include, but are not limited to, oxides of a combination of one or two or more selected from among metals, such as tin (Sn), titanium (Ti), aluminum (Al), zirconium (Zr), zinc (Zn), niobium (Nb), tantalum (Ta), and W (tungsten), and semimetals, such as boron (B), silicon (Si), germanium (Ge), arsenic (As), antimony (Sb), and tellurium (Te).

The resist underlayer film of the present invention has a thickness of, for example, 10 nm to 1,000 nm, or 20 nm to 500 nm, or 50 nm to 300 nm, or 100 nm to 200 nm.

Subsequently, for example, a photoresist film is formed on the resist underlayer film of the present invention. The photoresist film can be formed by a well-known method; i.e., application of a photoresist film-forming composition onto the resist underlayer film of the present invention, and then baking of the composition. The photoresist film has a thickness of, for example, 50 nm to 10,000 nm, or 100 nm to 2,000 nm, or 200 nm to 1,000 nm.

In another embodiment of the present invention, an organic underlayer film can be formed on the substrate, followed by formation of the resist underlayer film of the present invention on the organic underlayer film, and then formation of a photoresist film on the resist underlayer film. The pattern width of the photoresist film can be narrowed through this process. Thus, even when the photoresist film is formed thinly for preventing pattern collapse, the substrate can be processed through selection of an appropriate etching gas. For example, the resist underlayer film of the present invention can be processed by using, as an etching gas, a fluorine-containing gas that achieves a significantly high etching rate for the photoresist. The organic underlayer film can be processed by using, as an etching gas, an oxygen-containing gas that achieves a significantly high etching rate for the resist underlayer film of the present invention. The substrate can be processed by using, as an etching gas, a fluorine-containing gas that achieves a significantly high etching rate for the organic underlayer film.

The substrate and application method that can be used in this process are the same as those described above.

No particular limitation is imposed on the material of the photoresist film formed on the resist underlayer film of the present invention, so long as the material is sensitive to light used for exposure. The material may be either of negative photoresist and positive photoresist materials. Specific examples of the material include, but are not limited to, a positive photoresist material formed of a novolac resin and a 1,2-naphthoquinone diazide sulfonic acid ester; a chemically amplified photoresist material formed of a binder having a group that decomposes with an acid to thereby increase an alkali dissolution rate and a photoacid generator; a chemically amplified photoresist material formed of a low-molecular-weight compound that decomposes with an acid to thereby increase the alkali dissolution rate of the photoresist, an alkali-soluble binder, and a photoacid generator; and a chemically amplified photoresist material formed of a binder having a group that decomposes with an acid to thereby increase an alkali dissolution rate, a low-molecular-weight compound that decomposes with an acid to thereby increase the alkali dissolution rate of the photoresist, and a photoacid generator.

Specific examples of commercially available products include, but are not limited to, trade name APEX-E, available from Shipley, trade name PAR710, available from Sumitomo Chemical Company, Limited, and trade name SEPR430, available from Shin-Etsu Chemical Co., Ltd.

Other examples of suitably used materials include fluorine atom-containing polymer-based photoresist materials described, for example, in Proc. SPIE, Vol. 3999, 330-334 (2000), Proc. SPIE, Vol. 3999, 357-364 (2000), and Proc. SPIE, Vol. 3999, 365-374 (2000).

Subsequently, light exposure is performed through a predetermined mask. The light exposure may involve the use of, for example, a KrF excimer laser (wavelength: 248 nm), an ArF excimer laser (wavelength: 193 nm), or an F2 excimer laser (wavelength: 157 nm).

After the light exposure, post exposure bake may be performed if necessary. The post exposure bake is performed under appropriately determined conditions; i.e., a heating temperature of 70° C. to 150° C. and a heating time of 0.3 minutes to 10 minutes.

The present invention may involve the use of a resist material for electron beam lithography or a resist material for EUV lithography in place of the photoresist material.

The resist material for electron beam lithography may be either of negative and positive resist materials. Specific examples of the resist material for electron beam lithography include, but are not limited to, a chemically amplified resist material formed of an acid generator and a binder having a group that decomposes with an acid to thereby change an alkali dissolution rate; a chemically amplified resist material formed of an alkali-soluble binder, an acid generator, and a low-molecular-weight compound that decomposes with an acid to thereby change the alkali dissolution rate of the resist; a chemically amplified resist material formed of an acid generator, a binder having a group that decomposes with an acid to thereby change an alkali dissolution rate, and a low-molecular-weight compound that decomposes with an acid to thereby change the alkali dissolution rate of the resist; a non-chemically amplified resist material formed of a binder having a group that decomposes with electron beams to thereby change an alkali dissolution rate; and a non-chemically amplified resist material formed of a binder having a moiety that is cut with electron beams to thereby change an alkali dissolution rate. Also in the case of use of such a resist material for electron beam lithography, a resist pattern can be formed by using electron beams as an irradiation source in the same manner as in the case of using the photoresist material.

The resist material for EUV lithography may be a methacrylate resin-based resist material.

Subsequently, development is performed with a developer (e.g., an alkaline developer). When, for example, a positive photoresist material is used, an exposed portion of the photoresist is removed to thereby form a pattern of the photoresist.

Specific examples of the developer include, but are not limited to, alkaline aqueous solutions, for example, aqueous solutions of alkali metal hydroxides, such as potassium hydroxide and sodium hydroxide; aqueous solutions of quaternary ammonium hydroxides, such as tetramethylammonium hydroxide, tetraethylammonium hydroxide, and choline; and aqueous solutions of amines, such as ethanolamine, propylamine, and ethylenediamine.

The present invention may involve the use of an organic solvent as a developer. Thus, development is performed with a developer (organic solvent) after light exposure. When, for example, a negative photoresist material is used, an unexposed portion of the photoresist film is removed to thereby form a pattern of the photoresist film.

Specific examples of the organic solvent that may be used as a developer include, but are not limited to, methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate.

If necessary, the developer may contain a surfactant, etc.

The development is performed under appropriately determined conditions; i.e., a temperature of 5° C. to 50° C. and a time of 10 seconds to 600 seconds.

The resultant patterned photoresist film (upper layer) is used as a protective film to thereby remove the resist underlayer film (intermediate layer) of the present invention. Subsequently, the patterned photoresist film and the resist underlayer film (intermediate layer) of the present invention are used as protective films to thereby remove the organic underlayer film (lower layer). Finally, the patterned resist underlayer film (intermediate layer) of the present invention and the organic underlayer film (lower layer) are used as protective films to thereby process the semiconductor substrate.

Firstly, the resist underlayer film (intermediate layer) of the present invention is removed by dry etching at a portion where the photoresist film has been removed, to thereby expose the semiconductor substrate.

The dry etching of the resist underlayer film of the present invention can be performed with any of gases, such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, and dichloroborane.

The dry etching of the resist underlayer film is preferably performed with a halogen-containing gas. In general, a photoresist film formed of an organic substance is hard to remove by dry etching with a halogen-containing gas. In contrast, the resist underlayer film of the present invention, which contains numerous silicon atoms, is quickly removed by dry etching with a halogen-containing gas. Therefore, a reduction in the thickness of the photoresist film in association with the dry etching of the resist underlayer film can be suppressed. Thus, the photoresist film can be used in the form of thin film. The dry etching of the resist underlayer film is preferably performed with a fluorine-containing gas. Examples of the fluorine-containing gas include, but are not limited to, tetrafluoromethane ($CF_4$), perfluorocyclobutane ($C_4F_8$), perfluoropropane ($C_3F_8$), trifluoromethane, and difluoromethane ($CH_2F2$).

Thereafter, the patterned photoresist film and the resist underlayer film of the present invention are used as protective films to thereby remove the organic underlayer film. The organic underlayer film (lower layer) is preferably removed by dry etching with an oxygen-containing gas, since the resist underlayer film of the present invention, which contains numerous silicon atoms, is less likely to be removed by dry etching with an oxygen-containing gas.

Finally, the semiconductor substrate is processed. The processing of the semiconductor substrate is preferably performed by dry etching with a fluorine-containing gas.

Examples of the fluorine-containing gas include, but are not limited to, tetrafluoromethane ($CF_4$), perfluorocyclobutane ($C_4F_8$), perfluoropropane ($C_3F_8$), trifluoromethane, and difluoromethane ($CH_2F2$).

An organic anti-reflective coating may be formed on the resist underlayer film of the present invention before formation of the photoresist film. No particular limitation is imposed on a composition used for formation of the anti-reflective coating, and, for example, the composition may be appropriately selected from anti-reflective coating compositions that have been conventionally used in a lithographic process. The anti-reflective coating can be formed by a commonly used method, for example, application of the composition with a spinner or a coater, and subsequent baking of the composition.

The substrate to which the resist underlayer film-forming composition (composed of the film-forming composition of the present invention) is applied may have an organic or inorganic anti-reflective coating formed thereon by, for example, a CVD process. The resist underlayer film of the present invention may be formed on the anti-reflective coating. Even in the case where the resist underlayer film of the present invention is formed on the organic underlayer film formed on the substrate, the substrate used may have an organic or inorganic anti-reflective coating formed thereon by, for example, a CVD process.

The resist underlayer film formed from the resist underlayer film-forming composition of the present invention may absorb light used in a lithographic process depending on the wavelength of the light. In such a case, the resist underlayer film can function as an anti-reflective coating having the effect of preventing reflection of light from the substrate. Furthermore, the resist underlayer film of the present invention can be used as, for example, a layer for preventing the interaction between the substrate and the photoresist film; a layer having the function of preventing the adverse effect, on the substrate, of a material used for the photoresist film or a substance generated during the exposure of the photoresist film to light; a layer having the function of preventing diffusion of a substance generated from the substrate during heating and baking to the photoresist film; and a barrier layer for reducing a poisoning effect of a dielectric layer of the semiconductor substrate on the photoresist film.

The resist underlayer film formed from the resist underlayer film-forming composition of the present invention can be applied to a substrate having via holes for use in a dual damascene process, and can be used as an embedding material to fill up the holes. The resist underlayer film can also be used as a planarization material for planarizing the surface of a semiconductor substrate having irregularities.

The resist underlayer film functions as a hard mask for an EUV resist underlayer film. In addition, the resist underlayer film can be used for the following purposes. The resist underlayer film-forming composition of the present invention can be used for forming an anti-reflective EUV resist underlayer coating capable of, without intermixing with an EUV resist film, preventing the reflection, from a substrate or an interface, of exposure light undesirable for EUV exposure (e.g., the aforementioned deep ultraviolet (DUV) light). The resist underlayer film can efficiently prevent the light reflection as the underlayer film of the EUV resist film. When the resist underlayer film is used as an EUV resist underlayer film, the film can be processed in the same manner as in the photoresist underlayer film.

The film-forming composition of the present invention described above can be suitably used for the production of a semiconductor device. It is expected that a highly reliable semiconductor device can be effectively produced by the semiconductor device production method of the present invention, for example, a semiconductor device production method including a step of forming an organic underlayer film on a substrate; a step of forming, on the organic underlayer film, a resist underlayer film from the film-forming composition according to any one of claims 1 to 12; and a step of forming a resist film on the resist underlayer film.

EXAMPLES

The present invention will next be described in more detail with reference to Synthesis Examples and Examples, but the present invention should not be construed as being limited to the following Examples.

The weight average molecular weight of a polymer is determined by GPC analysis in terms of polystyrene. The GPC analysis was performed under the following conditions: GPC apparatus (trade name: HLC-8220GPC, available from Tosoh Corporation), GPC columns (trade name: Shodex KF803L, KF802, and KF801, available from Showa Denko K.K.), a column temperature of 40° C., tetrahydrofuran serving as an eluent (elution solvent), a flow amount (flow rate) of 1.0 mL/min, and polystyrene (available from Showa Denko K.K.) as a standard sample.

[1] Synthesis of Polymer (Hydrolysis Condensate)

Synthesis Example 1

A 300-mL flask was charged with 20.2 g of tetraethoxysilane [available from Tokyo Chemical Industry Co., Ltd.], 11.3 g of methyltriethoxysilane [available from Tokyo Chemical Industry Co., Ltd.], and 47.8 g of propylene glycol monoethyl ether, and then the mixture was stirred. While the resultant solution was stirred with a magnetic stirrer, a mixture of 20.4 g of aqueous p-phenolsulfonic acid solution (concentration: 0.2 mol/L) and 0.37 g of dimethylaminopropyltrimethoxysilane [available from Tokyo Chemical Industry Co., Ltd.] was added dropwise to the solution.

After completion of the dropwise addition, the flask was transferred to an oil bath set at 60° C., and the mixture was refluxed for 240 minutes. Thereafter, ethanol, methanol, and water were distilled off under reduced pressure, to thereby prepare a hydrolysis condensate (polymer) concentrate containing propylene glycol monoethyl ether as a solvent. The resultant concentrate was found to have a solid content concentration of more than 20% by mass in terms of solid residue content when heated at 140° C.

Subsequently, propylene glycol monoethyl ether was added to the resultant concentrate so as to achieve a concentration of 20% by mass in terms of solid residue content when heated at 140° C., to thereby produce a hydrolysis condensate (polymer) solution containing propylene glycol monoethyl ether as a solvent (solid content concentration: 20% by mass). The resultant polymer was found to have a structure of Formula (E1) and a weight average molecular weight (Mw) of 2,000 as determined by GPC in terms of polystyrene.

(E1)

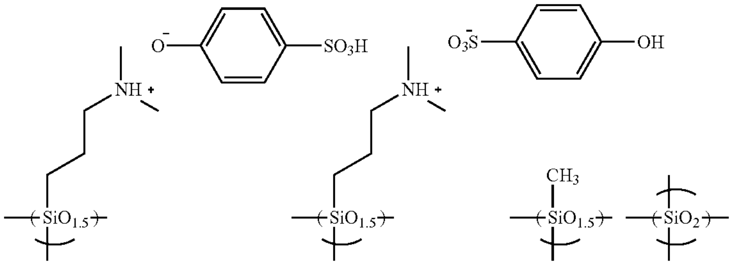

Synthesis Example 2

A hydrolysis condensate (polymer) solution (solid content concentration: 20% by mass) was produced in the same manner as in Synthesis Example 1, except that 20.4 g of aqueous p-phenolsulfonic acid solution (concentration: 0.2 mol/L) was replaced with 20.4 g of aqueous 5-sulfosalicylic acid solution (concentration: 0.2 mol/L). The resultant polymer was found to have a structure of Formula (E2) and a weight average molecular weight (Mw) of 2,100 as determined by GPC in terms of polystyrene.

(E2)

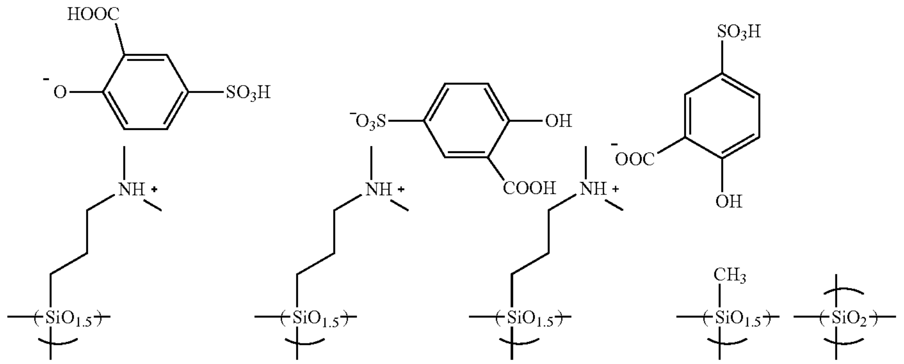

Synthesis Example 3

A hydrolysis condensate (polymer) solution (solid content concentration: 20% by mass) was produced in the same manner as in Synthesis Example 1, except that 20.4 g of aqueous p-phenolsulfonic acid solution (concentration: 0.2 mol/L) was replaced with 20.4 g of aqueous 4-sulfo-o-phthalic acid solution (concentration: 0.2 mol/L). The resultant polymer was found to have a structure of Formula (E3) and a weight average molecular weight (Mw) of 2,200 as determined by GPC in terms of polystyrene.

(E3)

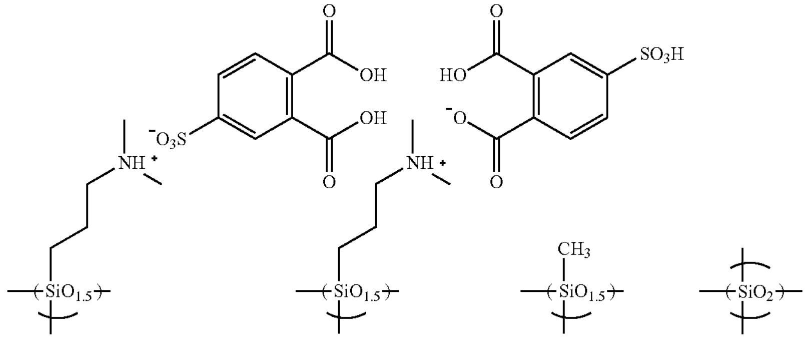

Synthesis Example 4

A hydrolysis condensate (polymer) solution (solid content concentration: 20% by mass) was produced in the same manner as in Synthesis Example 1, except that 20.4 g of aqueous p-phenolsulfonic acid solution (concentration: 0.2 mol/L) was replaced with 20.4 g of aqueous p-hydroxyphenylphosphonic acid solution (concentration: 0.2 mol/L). The resultant polymer was found to have a structure of Formula (E4) and a weight average molecular weight (Mw) of 2,500 as determined by GPC in terms of polystyrene.

(E4)

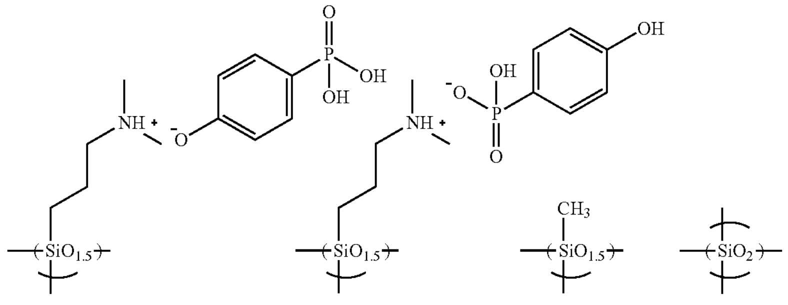

Synthesis Example 5

A hydrolysis condensate (polymer) solution (solid content concentration: 20% by mass) was produced in the same manner as in Synthesis Example 1, except that 20.4 g of aqueous p-phenolsulfonic acid solution (concentration: 0.2 mol/L) was replaced with 20.4 g of aqueous p-phosphonobenzoic acid solution (concentration: 0.2 mol/L). The resultant polymer was found to have a structure of Formula (E5) and a weight average molecular weight (Mw) of 2,400 as determined by GPC in terms of polystyrene.

(E5)

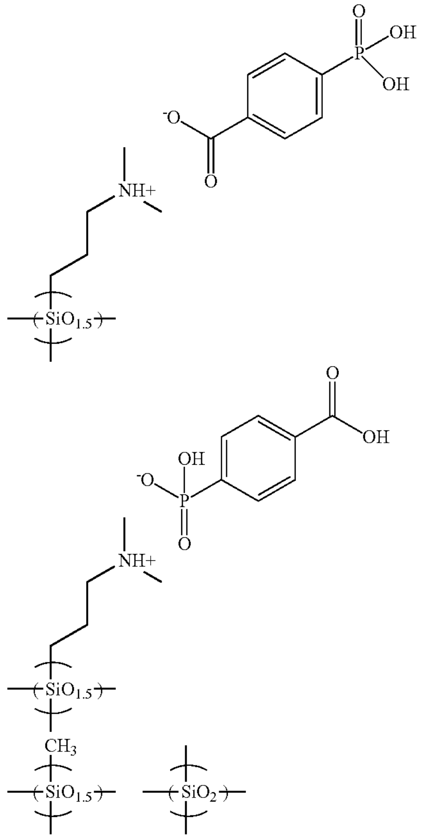

Synthesis Example 6

A hydrolysis condensate (polymer) solution (solid content concentration: 20% by mass) was produced in the same manner as in Synthesis Example 1, except that 20.4 g of aqueous p-phenolsulfonic acid solution (concentration: 0.2 mol/L) was replaced with 20.4 g of aqueous 4-hydroxybenzoic acid solution (concentration: 0.2 mol/L). The resultant polymer was found to have a structure of Formula (E6) and a weight average molecular weight (Mw) of 2,200 as determined by GPC in terms of polystyrene.

(E6)

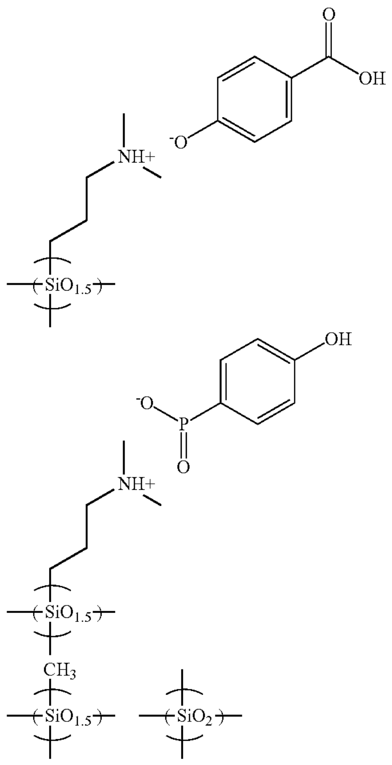

Synthesis Example 7

A 300-mL flask was charged with 19.9 g of tetraethoxysilane [available from Tokyo Chemical Industry Co., Ltd.], 9.65 g of methyltriethoxysilane [available from Tokyo Chemical Industry Co., Ltd.], 2.04 g of bicyclo[2.2.1]hept-5-en-2-yltriethoxysilane [available from Tokyo Chemical Industry Co., Ltd.], and 47.9 g of propylene glycol monoethyl ether, and then the mixture was stirred. While the resultant solution was stirred with a magnetic stirrer, a mixture of 20.0 g of aqueous 5-sulfosalicylic acid solution (concentration: 0.2 mol/L) and 0.36 g of dimethylaminopropyltrimethoxysilane [available from Tokyo Chemical Industry Co., Ltd.] was added dropwise to the solution.

After completion of the dropwise addition, the flask was transferred to an oil bath set at 60° C., and the mixture was refluxed for 240 minutes. Thereafter, ethanol, methanol, and water were distilled off under reduced pressure, to thereby prepare a hydrolysis condensate (polymer) concentrate containing propylene glycol monoethyl ether as a solvent. The resultant concentrate was found to have a solid content concentration of more than 20% by mass in terms of solid residue content when heated at 140° C.

Subsequently, propylene glycol monoethyl ether was added to the resultant concentrate so as to achieve a concentration of 20% by mass in terms of solid residue content when heated at 140° C., to thereby produce a hydrolysis condensate (polymer) solution containing propylene glycol monoethyl ether as a solvent (solid content concentration: 20% by mass). The resultant polymer was found to have a structure of Formula (E7) and a weight average molecular weight (Mw) of 2,200 as determined by GPC in terms of polystyrene.

(E7)

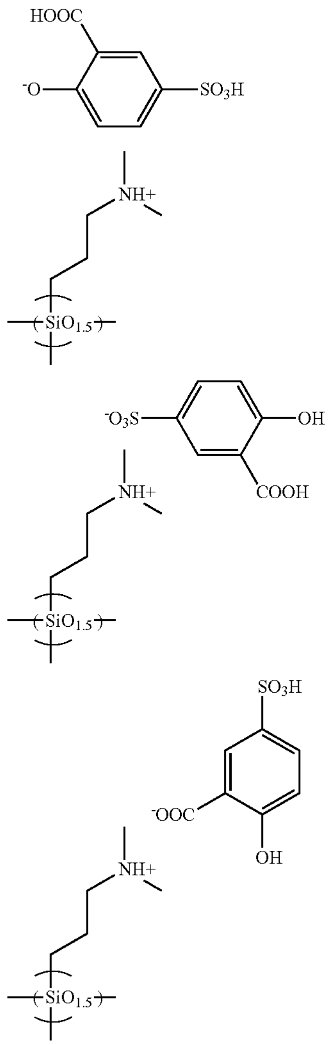

-continued

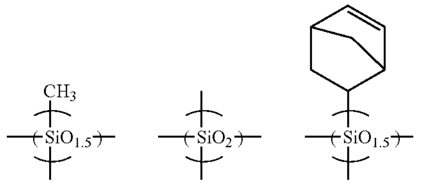

Synthesis Example 8

A 300-mL flask was charged with 19.3 g of tetraethoxysilane [available from Tokyo Chemical Industry Co., Ltd.], 9.36 g of methyltriethoxysilane [available from Tokyo Chemical Industry Co., Ltd.], 3.19 g of diallyl isocyanurate propyltriethoxysilane [available from Tokyo Chemical Industry Co., Ltd.], and 48.3 g of propylene glycol monoethyl ether, and then the mixture was stirred. While the resultant solution was stirred with a magnetic stirrer, a mixture of 19.48 g of aqueous 5-sulfosalicylic acid solution (concentration: 0.2 mol/L) and 0.35 g of dimethylaminopropyltrimethoxysilane [available from Tokyo Chemical Industry Co., Ltd.] was added dropwise to the solution. After completion of the dropwise addition, the flask was transferred to an oil bath set at 60° C., and the mixture was refluxed for 240 minutes. Thereafter, ethanol, methanol, and water were distilled off under reduced pressure, to thereby prepare a hydrolysis condensate (polymer) concentrate containing propylene glycol monoethyl ether as a solvent. The resultant concentrate was found to have a solid content concentration of more than 20% by mass in terms of solid residue content when heated at 140° C.

Subsequently, propylene glycol monoethyl ether was added to the resultant concentrate so as to achieve a concentration of 20% by mass in terms of solid residue content when heated at 140° C., to thereby produce a hydrolysis condensate (polymer) solution containing propylene glycol monoethyl ether as a solvent (solid content concentration: 20% by mass). The resultant polymer was found to have a structure of Formula (E8) and a weight average molecular weight (Mw) of 2,000 as determined by GPC in terms of polystyrene.

(E8)

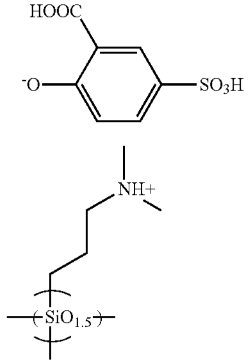

-continued

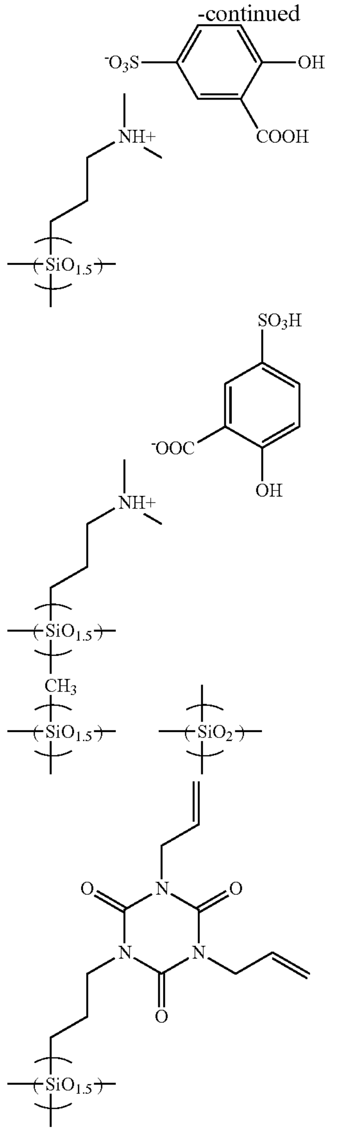

Synthesis Example 9

A 300-mL flask was charged with 19.9 g of tetraethoxysilane [available from Tokyo Chemical Industry Co., Ltd.], 9.64 g of methyltriethoxysilane [available from Tokyo Chemical Industry Co., Ltd.], 2.09 g of thiocyanatopropyltriethoxysilane [available from Tokyo Chemical Industry Co., Ltd.], and 48.0 g of propylene glycol monoethyl ether, and then the mixture was stirred. While the resultant solution was stirred with a magnetic stirrer, a mixture of 20.0 g of aqueous 5-sulfosalicylic acid solution (concentration: 0.2 mol/L) and 0.36 g of dimethylaminopropyltrimethoxysilane [available from Tokyo Chemical Industry Co., Ltd.] was added dropwise to the solution.

After completion of the dropwise addition, the flask was transferred to an oil bath set at 60° C., and the mixture was refluxed for 240 minutes. Thereafter, ethanol, methanol, and water were distilled off under reduced pressure, to thereby prepare a hydrolysis condensate (polymer) concentrate containing propylene glycol monoethyl ether as a solvent. The resultant concentrate was found to have a solid content concentration of more than 20% by mass in terms of solid residue content when heated at 140° C.

Subsequently, propylene glycol monoethyl ether was added to the resultant concentrate so as to achieve a concentration of 20% by mass in terms of solid residue content when heated at 140° C., to thereby produce a hydrolysis condensate (polymer) solution containing propylene glycol monoethyl ether as a solvent (solid content concentration: 20% by mass). The resultant polymer was found to have a structure of Formula (E9) and a weight average molecular weight (Mw) of 1,900 as determined by GPC in terms of polystyrene.

(E9)

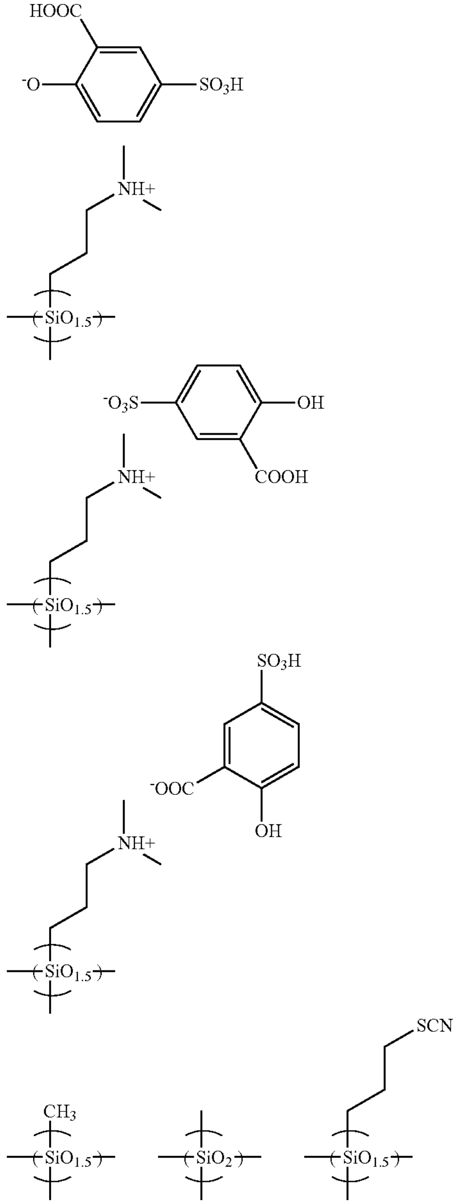

Synthesis Example 10

A 300-mL flask was charged with 19.6 g of tetraethoxysilane [available from Tokyo Chemical Industry Co., Ltd.], 9.49 g of methyltriethoxysilane [available from Tokyo Chemical Industry Co., Ltd.], 2.70 g of triethoxy((2-methoxy-4-(methoxymethyl)phenoxy)methyl)silane [available from Tokyo Chemical Industry Co., Ltd.], and 48.2 g of propylene glycol monoethyl ether, and then the mixture was stirred. While the resultant solution was stirred with a magnetic stirrer, a mixture of 20.0 g of aqueous 5-sulfosalicylic acid solution (concentration: 0.2 mol/L) and 0.36 g of dimethylaminopropyltrimethoxysilane [available from Tokyo Chemical Industry Co., Ltd.] was added dropwise to the solution.

After completion of the dropwise addition, the flask was transferred to an oil bath set at 60° C., and the mixture was refluxed for 240 minutes. Thereafter, ethanol, methanol, and water were distilled off under reduced pressure, to thereby prepare a hydrolysis condensate (polymer) concentrate containing propylene glycol monoethyl ether as a solvent. The resultant concentrate was found to have a solid content concentration of more than 20% by mass in terms of solid residue content when heated at 140° C.

Subsequently, propylene glycol monoethyl ether was added to the resultant concentrate so as to achieve a concentration of 20% by mass in terms of solid residue content when heated at 140° C., to thereby produce a hydrolysis condensate (polymer) solution containing propylene glycol monoethyl ether as a solvent (solid content concentration: 20% by mass). The resultant polymer was found to have a structure of Formula (E10) and a weight average molecular weight (Mw) of 2,700 as determined by GPC in terms of polystyrene.

(E10)

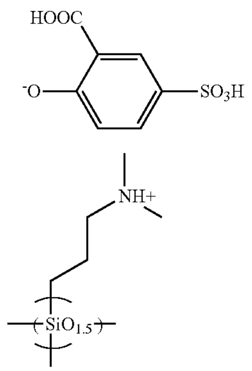

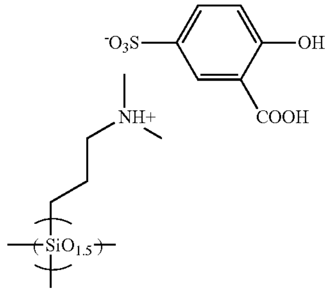

-continued

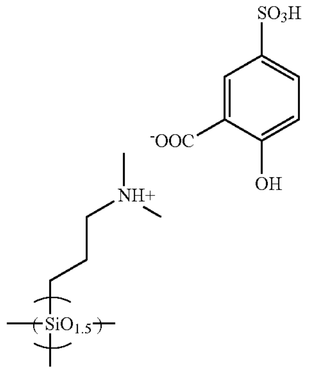

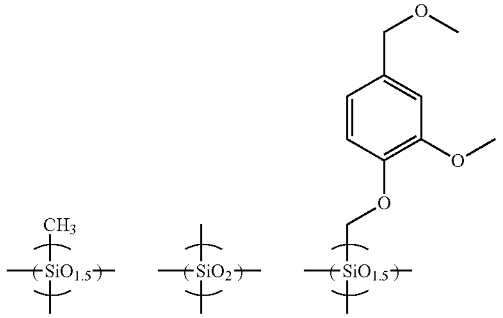

Synthesis Example 11

A 300-mL flask was charged with 23.3 g of tetraethoxysilane [available from Tokyo Chemical Industry Co., Ltd.], 7.11 g of methyltriethoxysilane [available from Tokyo Chemical Industry Co., Ltd.], 1.58 g of phenyltrimethoxysilane [available from Tokyo Chemical Industry Co., Ltd.], and 47.9 g of propylene glycol monoethyl ether, and then the mixture was stirred. While the resultant solution was stirred with a magnetic stirrer, 20.1 g of aqueous nitric acid solution (concentration: 0.2 mol/L) was added dropwise to the solution.

After completion of the dropwise addition, the flask was transferred to an oil bath set at 60° C., and the mixture was refluxed for 240 minutes. Thereafter, ethanol, methanol, and water were distilled off under reduced pressure, to thereby prepare a hydrolysis condensate (polymer) concentrate containing propylene glycol monoethyl ether as a solvent. The resultant concentrate was found to have a solid content concentration of more than 20% by mass in terms of solid residue content when heated at 140° C.

Subsequently, a solution prepared by dissolving 0.36 g of N,N-dimethyl-3-(trimethoxysilyl)propan-1-amine and 0.27 g of p-phenolsulfonic acid in propylene glycol monoethyl ether was added to the resultant concentrate so as to achieve a concentration of 20% by mass in terms of solid residue content when heated at 140° C., to thereby produce a hydrolysis condensate (polymer) solution containing propylene glycol monoethyl ether as a solvent (solid content concentration: 20% by mass). The resultant polymer was found to have a structure of Formula (E11) and a weight average molecular weight (Mw) of 2,500 as determined by GPC in terms of polystyrene.

(E11)

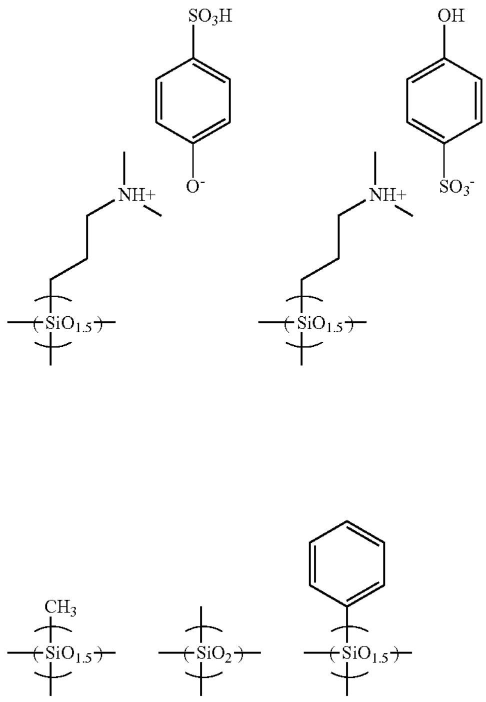

Synthesis Example 12

A 300-mL flask was charged with 23.3 g of tetraethoxysilane [available from Tokyo Chemical Industry Co., Ltd.], 7.11 g of methyltriethoxysilane [available from Tokyo Chemical Industry Co., Ltd.], 1.58 g of phenyltrimethoxysilane [available from Tokyo Chemical Industry Co., Ltd.], and 47.9 g of propylene glycol monoethyl ether, and then the mixture was stirred. While the resultant solution was stirred with a magnetic stirrer, 20.1 g of aqueous nitric acid solution (concentration: 0.2 mol/L) was added dropwise to the solution.

After completion of the dropwise addition, the flask was transferred to an oil bath set at 60° C., and the mixture was refluxed for 240 minutes. Thereafter, ethanol, methanol, and water were distilled off under reduced pressure, to thereby prepare a hydrolysis condensate (polymer) concentrate containing propylene glycol monoethyl ether as a solvent. The resultant concentrate was found to have a solid content concentration of more than 20% by mass in terms of solid residue content when heated at 140° C.

Subsequently, a solution prepared by dissolving 0.47 g of 1-(3-triethoxysilyl)propyl)-4,5-dihydro-1H-imidazole and 0.34 g of 5-sulfosalicylic acid in propylene glycol monoethyl ether was added to the resultant concentrate so as to achieve a concentration of 20% by mass in terms of solid residue content when heated at 140° C., to thereby produce a hydrolysis condensate (polymer) solution containing propylene glycol monoethyl ether as a solvent (solid content concentration: 20% by mass). The resultant polymer was found to have a structure of Formula (E12) and a weight average molecular weight (Mw) of 2,500 as determined by GPC in terms of polystyrene.

(E12)

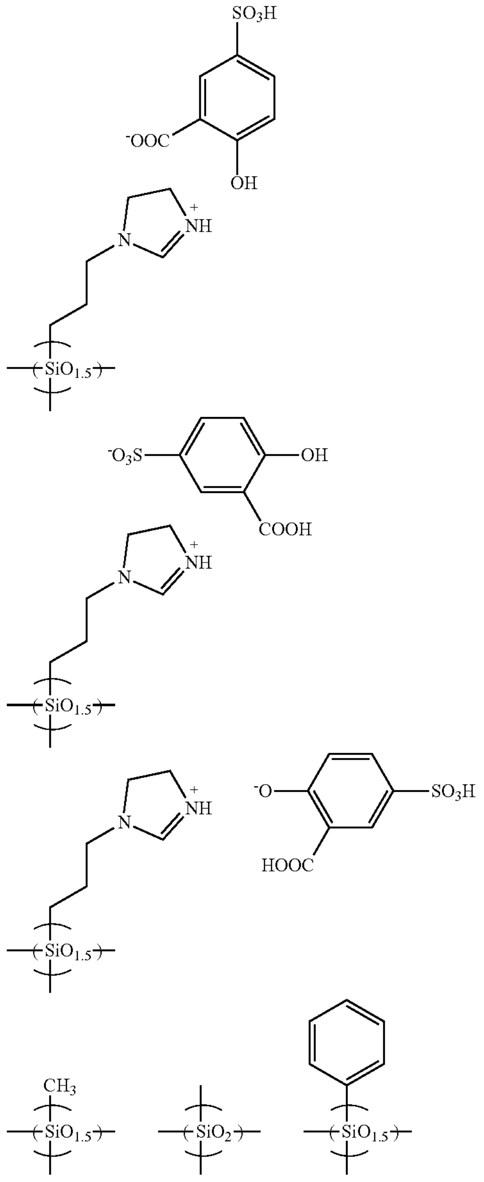

Comparative Synthesis Example 1

A 300-mL flask was charged with 20.3 g of tetraethoxysilane [available from Tokyo Chemical Industry Co., Ltd.], 11.6 g of triethoxymethylsilane [available from Tokyo Chemical Industry Co., Ltd.], and 47.7 g of propylene glycol monoethyl ether, and then the mixture was stirred. While the resultant solution was stirred with a magnetic stirrer, 20.4 g of aqueous nitric acid solution (concentration: 0.2 mol/L) was added dropwise to the mixed solution.

After completion of the dropwise addition, the flask was transferred to an oil bath set at 60° C., and the mixture was refluxed for 240 minutes. Thereafter, ethanol, methanol, and water were distilled off under reduced pressure, to thereby prepare a hydrolysis condensate (polymer) concentrate containing propylene glycol monoethyl ether as a solvent. The resultant concentrate was found to have a solid content concentration of more than 20% by mass in terms of solid residue content when heated at 140° C.

Subsequently, propylene glycol monoethyl ether was added to the resultant concentrate so as to achieve a concentration of 20% by mass in terms of solid residue content when heated at 140° C., to thereby produce a hydrolysis condensate (polymer) solution containing propylene glycol monoethyl ether as a solvent (solid content concentration: 20% by mass). The resultant polymer was found to have a structure of Formula (C1) and a weight average molecular weight (Mw) of 1,700 as determined by GPC in terms of polystyrene.

(C1)

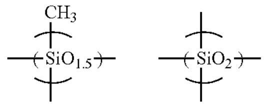

Comparative Synthesis Example 2

A 300-mL flask was charged with 20.3 g of tetraethoxysilane [available from Tokyo Chemical Industry Co., Ltd.], 11.6 g of triethoxymethylsilane [available from Tokyo Chemical Industry Co., Ltd.], and 47.7 g of propylene glycol monoethyl ether, and then the mixture was stirred. While the resultant solution was stirred with a magnetic stirrer, 20.4 g of aqueous methanesulfonic acid solution (0.2 mol/L) was added dropwise to the mixed solution.

After completion of the dropwise addition, the flask was transferred to an oil bath set at 60° C., and the mixture was refluxed for 240 minutes. Thereafter, ethanol, methanol, and water were distilled off under reduced pressure, to thereby prepare a hydrolysis condensate (polymer) concentrate containing propylene glycol monoethyl ether as a solvent. The resultant concentrate was found to have a solid content concentration of more than 20% by mass in terms of solid residue content when heated at 140° C.

Subsequently, propylene glycol monoethyl ether was added to the resultant concentrate so as to achieve a concentration of 20% by mass in terms of solid residue content when heated at 140° C., to thereby produce a hydrolysis condensate (polymer) solution containing propylene glycol monoethyl ether as a solvent (solid content concentration: 20% by mass). The resultant polymer was found to have a structure of Formula (C2) and a weight average molecular weight (Mw) of 1,900 as determined by GPC in terms of polystyrene.

(C2)

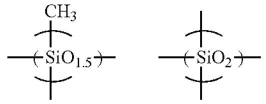

Comparative Synthesis Example 3

A hydrolysis condensate (polymer) solution (solid content concentration: 20% by mass) was produced in the same manner as in Synthesis Example 1, except that 20.4 g of aqueous p-phenolsulfonic acid solution (concentration: 0.2 mol/L) was replaced with 20.4 g of aqueous benzoic acid solution (concentration: 0.2 mol/L). The resultant polymer was found to have a structure of Formula (C3) and a weight average molecular weight (Mw) of 2,400 as determined by GPC in terms of polystyrene.

(C3)

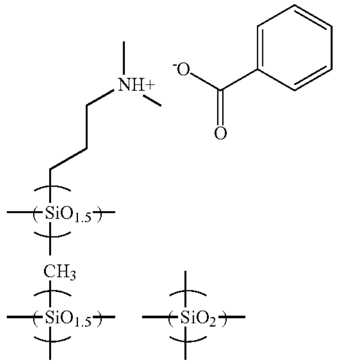

Comparative Synthesis Example 4

A hydrolysis condensate (polymer) solution (solid content concentration: 20% by mass) was produced in the same manner as in Synthesis Example 1, except that 20.4 g of aqueous p-phenolsulfonic acid solution (concentration: 0.2 mol/L) was replaced with 20.4 g of aqueous benzenesulfonic acid solution (concentration: 0.2 mol/L). The resultant polymer was found to have a structure of Formula (C4) and a weight average molecular weight (Mw) of 2,800 as determined by GPC in terms of polystyrene.

(C4)

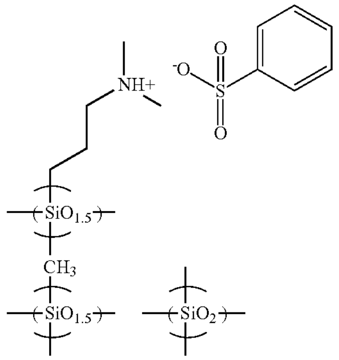

Comparative Synthesis Example 5

A hydrolysis condensate (polymer) solution (solid content concentration: 20% by mass) was produced in the same manner as in Synthesis Example 1, except that 20.4 g of aqueous p-phenolsulfonic acid solution (concentration: 0.2 mol/L) was replaced with 20.4 g of aqueous phenol solution (concentration: 0.2 mol/L). The resultant polymer was found to have a structure of Formula (C5) and a weight average molecular weight Mw of 700 as determined by GPC in terms of polystyrene.

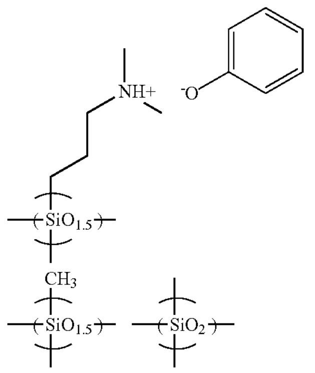
(C5)

[2] Preparation of Film-Forming Composition

Each of the polysiloxanes (polymers) produced in the aforementioned Synthesis Examples, an acid (additive 1), a photoacid generator (additive 2), and a solvent were mixed in proportions shown in Table 1, and the resultant mixture was filtered with a fluororesin-made filter (0.1 μm), to thereby prepare a film-forming composition. In Table 1, the amount of each component added is shown by part(s) by mass.

The amount of each polymer shown in Table 1 corresponds not to the amount of the polymer solution, but to the amount of the polymer itself.

In Table 1, DIW denotes ultrapure water; PGEE, propylene glycol monoethyl ether; PGMEA, propylene glycol monomethyl ether acetate; and PGME, propylene glycol monomethyl ether.

Furthermore, MA denotes maleic acid; and TPSNO3, triphenylsulfonium nitrate.

TABLE 1

| | Polymer | Additive 1 | Additive 2 | Solvent | | | |
|---|---|---|---|---|---|---|---|
| Example 1 | Synthesis Example 1 | MA | | PGEE | PGMEA | PGME | DIW |
| (part(s) by mass) | 1 | 0.03 | | 40 | 10 | 38 | 12 |
| Example 2 | Synthesis Example 2 | MA | | PGEE | PGMEA | PGME | DIW |
| (part(s) by mass) | 1 | 0.03 | | 40 | 10 | 38 | 12 |
| Example 3 | Synthesis Example 3 | MA | | PGEE | PGMEA | PGME | DIW |
| (part(s) by mass) | 1 | 0.03 | | 40 | 10 | 38 | 12 |
| Example 4 | Synthesis Example 4 | MA | | PGEE | PGMEA | PGME | DIW |
| (part(s) by mass) | 1 | 0.03 | | 40 | 10 | 38 | 12 |
| Example 5 | Synthesis Example 5 | MA | | PGEE | PGMEA | PGME | DIW |
| (part(s) by mass) | 1 | 0.03 | | 40 | 10 | 38 | 12 |
| Example 6 | Synthesis Example 6 | MA | | PGEE | PGMEA | PGME | DIW |
| (part(s) by mass) | 1 | 0.03 | | 40 | 10 | 38 | 12 |
| Example 7 | Synthesis Example 7 | MA | | PGEE | PGMEA | PGME | DIW |
| (part(s) by mass) | 1 | 0.03 | | 40 | 10 | 38 | 12 |
| Example 8 | Synthesis Example 8 | MA | | PGEE | PGMEA | PGME | DIW |
| (part(s) by mass) | 1 | 0.03 | | 40 | 10 | 38 | 12 |
| Example 9 | Synthesis Example 9 | MA | | PGEE | PGMEA | PGME | DIW |
| (part(s) by mass) | 1 | 0.03 | | 40 | 10 | 38 | 12 |
| Example 10 | Synthesis Example 10 | MA | | PGEE | PGMEA | PGME | DIW |
| (part(s) by mass) | 1 | 0.03 | | 40 | 10 | 38 | 12 |
| Example 11 | Synthesis Example 11 | MA | TPSNO3 | PGEE | PGMEA | PGME | DIW |
| (part(s) by mass) | 1 | 0.03 | 0.03 | 40 | 10 | 38 | 12 |
| Example 12 | Synthesis Example 12 | MA | TPSNO3 | PGEE | PGMEA | PGME | DIW |
| (part(s) by mass) | 1 | 0.03 | 0.03 | 40 | 10 | 38 | 12 |
| Comparative Example 1 | Comparative Synthesis Example 1 | MA | | PGEE | PGMEA | PGME | DIW |
| (part(s) by mass) | 1 | 0.03 | | 40 | 10 | 38 | 12 |
| Comparative Example 2 | Comparative Synthesis Example 2 | MA | TPSNO3 | PGEE | PGMEA | PGME | DIW |
| (part(s) by mass) | 1 | 0.03 | 0.05 | 40 | 10 | 38 | 12 |
| Comparative Example 3 | Comparative Synthesis Example 3 | MA | TPSNO3 | PGEE | PGMEA | PGME | DIW |
| (part(s) by mass) | 1 | 0.03 | 0.05 | 40 | 10 | 38 | 12 |
| Comparative Example 4 | Comparative Synthesis Example 4 | MA | TPSNO3 | PGEE | PGMEA | PGME | DIW |

TABLE 1-continued

| | Polymer | Additive 1 | Additive 2 | Solvent | | | |
|---|---|---|---|---|---|---|---|
| (part(s) by mass) | 1 | 0.03 | 0.05 | 40 | 10 | 38 | 12 |
| Comparative Example 5 | Comparative Synthesis Example 5 | MA | TPSNO3 | PGEE | PGMEA | PGME | DIW |
| (part(s) by mass) | 1 | 0.03 | 0.05 | 40 | 10 | 38 | 12 |

[3] Preparation of Organic Underlayer Film-Forming Composition

In a nitrogen atmosphere, a 100-mL four-necked flask was charged with 6.69 g (0.040 mol) of carbazole (available from Tokyo Chemical Industry Co., Ltd.), 7.28 g (0.040 mol) of 9-fluorenone (available from Tokyo Chemical Industry Co., Ltd.), and 0.76 g (0.0040 mol) of p-toluenesulfonic acid monohydrate (available from Tokyo Chemical Industry Co., Ltd.), and then 6.69 g of 1,4-dioxane (available from KANTO CHEMICAL CO., INC.) was added to the flask. The resultant mixture was stirred and heated to 100° C. for dissolution, to thereby initiate polymerization. After the elapse of 24 hours, the reaction mixture was left to cool to 60° C.

The cooled reaction mixture was then diluted with 34 g of chloroform (available from KANTO CHEMICAL CO., INC.), and the diluted mixture was added to 168 g of methanol (available from KANTO CHEMICAL CO., INC.) for precipitation.

The resultant precipitate was filtered, and the filtrate was dried with a reduced-pressure dryer at 80° C. for 24 hours, to thereby yield 9.37 g of a target polymer of Formula (3-1) (hereinafter abbreviated as "PCzFL").

The results of $^1$H-NMR analysis of PCzFL were as follows:

$^1$H-NMR (400 MHz, DMSO-$d_6$): δ7.03-7.55 (br, 12H), δ7.61-8.10 (br, 4H), δ11.18 (br, 1H).

PCzFL was found to have a weight average molecular weight Mw of 2,800 as determined by GPC in terms of polystyrene and a polydispersity Mw/Mn of 1.77.

(3-1)

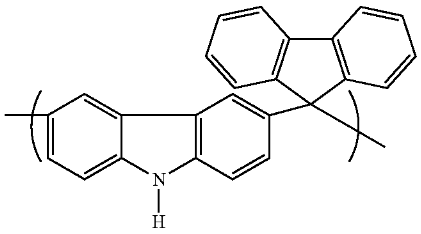

Subsequently, 20 g of PCzFL was mixed with 3.0 g of tetramethoxymethyl glycoluril (trade name: Powderlink 1174, available from Cytec Industries Japan (former Mitsui Cytec Ltd.)) serving as a crosslinking agent, 0.30 g of pyridinium p-toluenesulfonate serving as a catalyst, and 0.06 g of MEGAFAC R-30 (trade name, available from DIC Corporation) serving as a surfactant, and the mixture was dissolved in 88 g of propylene glycol monomethyl ether acetate. Thereafter, the resultant solution was filtered with a polyethylene-made microfilter (pore size: 0.10 μm), and then filtered with a polyethylene-made microfilter (pore size: 0.05 μm), to thereby prepare an organic underlayer film-forming composition used for a lithographic process using a multilayer film.

[4] Tests for Solvent Resistance and Resistance to Dissolution in Developer

Each of the film-forming compositions prepared in Examples 1 to 12 and Comparative Examples 1 and 5 was applied onto a silicon wafer with a spinner, and then heated on a hot plate at 215° C. for one minute, to thereby form an Si-containing film. The thickness of the resultant Si-containing film was measured.

Subsequently, a mixed solvent of propylene glycol monomethyl ether/propylene glycol monomethyl ether acetate (7/3 (V/V)) was applied onto the Si-containing film, and then spin-dried. The thickness of the dried Si-containing film was measured, to thereby evaluate a change in film thickness between before and after application of the mixed solvent. Solvent resistance was evaluated as "Good" or "Not cured" when a change in film thickness after application of the mixed solvent was less than 1% or 1% or more, respectively, on the basis of the thickness before application of the mixed solvent.

Separately, an alkaline developer (2.38% aqueous TMAH solution) was applied onto an Si-containing film formed on a silicon wafer in the same manner as described above, and then spin-dried. The thickness of the dried underlayer film was measured, to thereby evaluate a change in film thickness between before and after application of the developer. Developer resistance was evaluated as "Good" or "Not cured" when a change in film thickness was less than 1% or 1% or more, respectively, on the basis of the thickness before application of the developer.

The results are shown in Table 2.

TABLE 2

| Film-forming composition | Solvent resistance | Developer resistance |
|---|---|---|
| Example 1 | Good | Good |
| Example 2 | Good | Good |
| Example 3 | Good | Good |
| Example 4 | Good | Good |
| Example 5 | Good | Good |
| Example 6 | Good | Good |
| Example 7 | Good | Good |
| Example 8 | Good | Good |
| Example 9 | Good | Good |
| Example 10 | Good | Good |
| Example 11 | Good | Good |
| Example 12 | Good | Good |
| Comparative Example 1 | Not cured | Not cured |
| Comparative Example 5 | Good | Not cured |

As shown in Table 2, a film formed from the film-forming composition of the present invention exhibited good resistance to a solvent and a developer.

[5] Measurement of Dry Etching Rate

The following etchers and etching gases were used for measurement of dry etching rate.

Lam2300 (available from Lam Research Co., Ltd.): $CF_4$/$CHF_3$/$N_2$ (fluorine-containing gas)

RIE-10NR (available from SAMCO Inc.): $O_2$ (oxygen-containing gas)

Each of the film-forming compositions prepared in Examples 1 to 12 was applied onto a silicon wafer with a spinner, and then heated on a hot plate at 215° C. for one minute, to thereby form an Si-containing film (thickness: 0.02 μm).

Similarly, the aforementioned organic underlayer film-forming composition was applied onto a silicon wafer with a spinner, and then heated on a hot plate at 215° C. for one minute, to thereby form an organic underlayer film (thickness: 0.20 μm).

The resultant silicon wafer provided with the Si-containing film was used for measurement of dry etching rate with $CF_4/CHF_3/N_2$ gas and $O_2$ gas as etching gases. Also, the silicon wafer provided with the organic underlayer film was used for measurement of dry etching rate with $O_2$ gas as an etching gas. The results are shown in Table 3.

The dry etching rate of the Si-containing film with $O_2$ gas was expressed as the ratio (resistance) relative to the dry etching rate of the organic underlayer film.

TABLE 3

| Film-forming composition | Etching rate with fluorine-containing gas (nm/min) | Oxygen-containing gas resistance (ratio relative to organic underlayer film) |
|---|---|---|
| Example 1 | 38 | 0.02 |
| Example 2 | 42 | 0.02 |
| Example 3 | 38 | 0.02 |
| Example 4 | 40 | 0.03 |
| Example 5 | 38 | 0.02 |
| Example 6 | 37 | 0.02 |
| Example 7 | 36 | 0.02 |
| Example 8 | 42 | 0.04 |
| Example 9 | 44 | 0.02 |
| Example 10 | 36 | 0.03 |
| Example 11 | 36 | 0.02 |
| Example 12 | 34 | 0.02 |

As shown in Table 3, a film formed from the film-forming composition of the present invention exhibited a high etching rate with respect to a fluorine-containing gas, and better resistance to an oxygen-containing gas than an organic underlayer film.

[6] Measurement of Wet Etching Rate

Each of the film-forming compositions prepared in Examples 1 to 12 and Comparative Examples 2 and 4 was applied onto a silicon wafer with a spinner, and then heated on a hot plate at 215° C. for one minute, to thereby form an Si-containing film (thickness: 0.02 μm).

The resultant silicon wafer provided with the Si-containing film was used for measurement of wet etching rate with an aqueous $NH_3/HF$ mixed solution as a wet etching agent. When the wet etching rate was 10 nm/min or more, evaluation "Good" was given, whereas when the wet etching rate was less than 10 nm/min, evaluation "Poor" was given. The results are shown in Table 4.

TABLE 4

| Film-forming composition | Aqueous $NH_3/HF$ solution Wet etching rate |
|---|---|
| Example 1 | Good |
| Example 2 | Good |
| Example 3 | Good |
| Example 4 | Good |
| Example 5 | Good |
| Example 6 | Good |
| Example 7 | Good |
| Example 8 | Good |
| Example 9 | Good |
| Example 10 | Good |
| Example 11 | Good |
| Example 12 | Good |
| Comparative Example 2 | Poor |
| Comparative Example 4 | Poor |

As shown in Table 4, a film formed from the film-forming composition of the present invention exhibited a high wet etching rate with respect to a wet etching agent.

[7] Formation of Resist Pattern by EUV Exposure: Negative Solvent Development

The aforementioned organic underlayer film-forming composition was applied onto a silicon wafer by spin coating, and then heated on a hot plate at 215° C. for one minute, to thereby form an organic underlayer film (layer A) (thickness: 90 nm).

The film-forming composition prepared in Example 1 was applied onto the organic underlayer film by spin coating, and then heated on a hot plate at 215° C. for one minute, to thereby form a resist underlayer film (layer B) (thickness: 20 nm).

An EUV resist solution (methacrylate resin-based resist) was applied onto the resist underlayer film by spin coating, and then heated on a hot plate at 130° C. for one minute, to thereby form an EUV resist film (layer C). Thereafter, the EUV resist film was exposed to light with an EUV exposure apparatus (NXE3300B, available from ASML) under the following conditions: NA: 0.33, σ: 0.67/0.90, Dipole.

After the light exposure, post exposure bake (at 110° C. for one minute) was performed, and the resultant product was cooled on a cooling plate to room temperature, followed by development with an organic solvent developer (butyl acetate) for one minute and subsequent rinsing treatment, to thereby form a resist pattern.

Each of the compositions prepared in Examples 2 to 12 and Comparative Examples 3 and 5 was used, and a resist pattern was formed through the same procedure as described above.

Each of the thus-formed resist patterns was evaluated for formation of a 44 nm pitch and a 22 nm line-and-space by determining the pattern shape through observation of a cross section of the pattern.

In the observation of the pattern shape, evaluation "Good" was given to a shape between footing and undercut and a state of no significant residue in a space portion; evaluation "Collapse" was given to an unfavorable state of peeling and collapse of the resist pattern; and evaluation "Bridge" was given to an unfavorable state of contact between upper portions or lower portions of the resist pattern. The results are shown in Table 5.

TABLE 5

| Film-forming composition | Evaluation result |
|---|---|
| Example 1 | Good |
| Example 2 | Good |
| Example 3 | Good |
| Example 4 | Good |
| Example 5 | Good |
| Example 6 | Good |
| Example 7 | Good |

TABLE 5-continued

| Film-forming composition | Evaluation result |
|---|---|
| Example 8 | Good |
| Example 9 | Good |
| Example 10 | Good |
| Example 11 | Good |
| Example 12 | Good |
| Comparative Example 3 | Collapse |
| Comparative Example 5 | Collapse |

As shown in Table 5, a film formed from the film-forming composition of the present invention effectively functioned as a resist underlayer film, and achieved excellent lithographic property.

[8] Formation of Resist Pattern by EUV Exposure: Positive Alkali Development

The aforementioned organic underlayer film-forming composition was applied onto a silicon wafer by spin coating, and then heated on a hot plate at 215° C. for one minute, to thereby form an organic underlayer film (layer A) (thickness: 90 nm).

The film-forming composition prepared in Example 11 was applied onto the organic underlayer film by spin coating, and then heated on a hot plate at 215° C. for one minute, to thereby form a resist underlayer film (layer B) (thickness: 20 nm).

An EUV resist solution (methacrylate resin-based resist) was applied onto the resist underlayer film by spin coating, and then heated on a hot plate at 130° C. for one minute, to thereby form an EUV resist film (layer C). Thereafter, the EUV resist film was exposed to light with an EUV exposure apparatus (NXE3300B, available from ASML) under the following conditions: NA: 0.33, σ: 0.67/0.90, Dipole.

After the light exposure, post exposure bake (at 110° C. for one minute) was performed, and the resultant product was cooled on a cooling plate to room temperature, followed by development with an alkaline developer (aqueous TMAH solution) for one minute and subsequent rinsing treatment, to thereby form a resist pattern.

Each of the compositions prepared in Example 12 and Comparative Example 4 was used, and a resist pattern was formed through the same procedure as described above.

Each of the thus-formed resist patterns was evaluated for formation of a 44 nm pitch and a 22 nm line-and-space by determining the pattern shape through observation of a cross section of the pattern.

In the observation of the pattern shape, evaluation “Good” was given to a shape between footing and undercut and a state of no significant residue in a space portion; evaluation “Collapse” was given to an unfavorable state of peeling and collapse of the resist pattern; and evaluation “Bridge” was given to an unfavorable state of contact between upper portions or lower portions of the resist pattern. The results are shown in Table 6.

TABLE 6

| Film-forming composition | Evaluation result |
|---|---|
| Example 11 | Good |
| Example 12 | Good |
| Comparative Example 4 | Collapse |

As shown in Table 6, a film formed from the film-forming composition of the present invention effectively functioned as a resist underlayer film, and achieved excellent lithographic property.

The invention claimed is:

1. A film-forming composition comprising a solvent and a condensate of a hydrolyzable silane compound, wherein:

the condensate of the hydrolyzable silane compound contains an acidic compound containing two or more acidic groups and an amino-group-containing silane of the following Formula (1):

$$R^1_a R^2_b Si(R^3)_{4-(a+b)} \quad (1)$$

where:

$R^1$ is a group bonded to the silicon atom, and is each independently an organic group containing an amino group, wherein the organic group containing an amino group is a group of the following Formula (A1):

(A1)

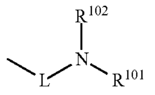

$R^{101}$ and $R^{102}$ are each independently a hydrogen atom or a hydrocarbon group;

L is a substitutable alkylene group;

$R^2$ is a group bonded to the silicon atom, and is a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, or a cyano group;

$R^3$ is a group or atom bonded to the silicon atom, and is each independently an alkoxy group, an aralkyloxy group, an acyloxy group, or a halogen atom;

a is an integer of 1 or 2;

b is an integer of 0 or 1; and a and b satisfy a relation of a+b≤2.

2. The film-forming composition according to claim 1, wherein the two or more acidic groups contain two or more mutually different groups selected from the group consisting of a sulfonate group, a phosphate group, a carboxy group, and a phenolic hydroxy group.

3. The film-forming composition according to claim 2, wherein the two or more acidic groups contain at least one selected from the group consisting of a sulfonate group, a phosphate group, a carboxy group, and a phenolic hydroxy group, and at least one selected from the group consisting of a carboxy group and a phenolic hydroxy group.

4. The film-forming composition according to claim 1, wherein the acidic compound contains an aromatic ring.

5. The film-forming composition according to claim 4, wherein at least one of the two or more acidic groups is directly bonded to the aromatic ring.

6. The film-forming composition according to claim 5, wherein all of the two or more acidic groups are directly bonded to the aromatic ring.

7. The film-forming composition according to claim 1, wherein the acidic compound contains an acidic compound containing two or three acidic groups.

8. The film-forming composition according to claim 1, wherein the two or more acidic groups are a sulfonate group and a phenolic hydroxy group; a sulfonate group and a carboxy group; a sulfonate group, a carboxy group, and a phenolic hydroxy group; a phosphate group and a phenolic hydroxy group; a phosphate group and a carboxy group; a phosphate group, a carboxy group, and a phenolic hydroxy group; or a carboxy group and a phenolic hydroxy group.

9. The film-forming composition according to claim 1, wherein the acidic compound contains an acidic compound of the following Formula(S):

$$(R^{A})_{q}—Ar—(R^{S})_{r} \quad (S)$$

where:

Ar is a $C_{6-20}$ aromatic ring;

$R^{A}$ is an acidic group;

$R^{S}$ is a substituent;

q is the number of acidic groups bonded to the aromatic ring, and is an integer of 2 to 5;

r is the number of substituents bonded to the aromatic ring, and is an integer of 0 to 3;

q $R^{A}_{S}$ are mutually different groups; and r $R^{S}_{S}$ are identical to or different from one another.

10. The film-forming composition according to claim 1, wherein the alkylene group is a linear alkylene group having a carbon atom number of 1 to 10 or a branched alkylene group having a carbon atom number of 3 to 10.

11. The film-forming composition according to claim 1, wherein the composition is for forming a resist underlayer film used in a lithographic process.

12. A resist underlayer film formed from the film-forming composition according to claim 1.

13. A method for producing a semiconductor device, the method comprising:

a step of forming an organic underlayer film on a substrate;

a step of forming, on the organic underlayer film, a resist underlayer film from the film-forming composition according to claim 1; and a step of forming a resist film on the resist underlayer film.

* * * * *